(12) United States Patent
Kikuchi et al.

(10) Patent No.: US 10,797,082 B2
(45) Date of Patent: Oct. 6, 2020

(54) THIN FILM TRANSISTOR ARRAY SUBSTRATE AND METHOD OF PRODUCING THE SAME

(71) Applicant: Sharp Kabushiki Kaisha, Sakai, Osaka (JP)

(72) Inventors: Tetsuo Kikuchi, Sakai (JP); Tohru Daitoh, Sakai (JP); Hajime Imai, Sakai (JP); Masahiko Suzuki, Sakai (JP); Setsuji Nishimiya, Sakai (JP); Teruyuki Ueda, Sakai (JP); Kengo Hara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/132,509

(22) Filed: Sep. 17, 2018

(65) Prior Publication Data

US 2019/0103421 A1   Apr. 4, 2019

(30) Foreign Application Priority Data

Sep. 29, 2017 (JP) ................................. 2017-191556

(51) Int. Cl.
*H01L 27/12* (2006.01)
*G02F 1/1345* (2006.01)
(Continued)

(52) U.S. Cl.
CPC ...... *H01L 27/1225* (2013.01); *G02F 1/13338* (2013.01); *G02F 1/13452* (2013.01); *G02F 1/134309* (2013.01); *G02F 1/136286* (2013.01); *G06F 3/044* (2013.01); *G06F 3/0412* (2013.01); *H01L 27/124* (2013.01); *H01L 27/127* (2013.01); *H01L 27/1248* (2013.01); *H01L 27/1288* (2013.01); *H01L 29/45* (2013.01);
(Continued)

(58) Field of Classification Search
CPC combination set(s) only.
See application file for complete search history.

(56) References Cited

U.S. PATENT DOCUMENTS

2014/0320439 A1* 10/2014 Yang .................. G02F 1/13338
                                                        345/173
2015/0129865 A1*  5/2015 Miyamoto ............ G02F 1/1368
                                                         257/43

FOREIGN PATENT DOCUMENTS

JP           5599026 B       10/2014

* cited by examiner

*Primary Examiner* — Ratisha Mehta
(74) *Attorney, Agent, or Firm* — Keating & Bennett, LLP

(57) ABSTRACT

A TFT array substrate includes gate electrodes constructed from a first metal film, a first insulating film on the first metal film, channels constructed from a semiconductor film on the first insulating film, source electrodes constructed from a second metal film on the semiconductor film, drain electrodes constructed from the second metal film, pixel electrodes constructed from portions of the semiconductor film having reduced resistances, a second insulating film on the semiconductor film and the second metal film, and a common electrode constructed from a transparent electrode film on the second insulating film. The channels overlap the gate electrodes. The source electrodes and the drain electrodes are connected to first ends and second ends of the channels, respectively. The pixel electrodes are connected to the drain electrodes. The second insulating film includes sections overlapping the pixel electrodes without openings. The common electrode overlaps at least the pixel electrodes.

4 Claims, 26 Drawing Sheets

(51) Int. Cl.
   *G02F 1/1343* (2006.01)
   *G02F 1/1333* (2006.01)
   *G06F 3/041* (2006.01)
   *G02F 1/1362* (2006.01)
   *H01L 29/45* (2006.01)
   *G06F 3/044* (2006.01)
(52) U.S. Cl.
   CPC .. *G02F 2201/121* (2013.01); *G02F 2201/123* (2013.01)

THIN FILM TRANSISTOR ARRAY SUBSTRATE AND METHOD OF PRODUCING THE SAME

CROSS REFERENCE TO RELATED APPLICATION

This application claims priority from Japanese Patent Application No. 2017-191556 filed on Sep. 29, 2017. The entire contents of the priority application are incorporated herein by reference.

TECHNICAL FIELD

The technology described herein relates to a thin film transistor array substrate and a method of producing the thin film transistor array substrate.

BACKGROUND

A known method of producing a thin film array substrate including thin film transistors included in a liquid crystal display device includes a first process, a second process, a third process, a fourth process, a fifth process, and a sixth process. The first process includes forming gate electrodes on a substrate. The second process includes forming a first insulating layer on the first electrodes, forming oxide semiconductor layers on the first insulating layers, and forming electrode layers on the oxide semiconductor layers. The third process includes forming a photo resist on the electrode layers, exposing the photo resist using a halftone mask, and developing the photo resist, forming a resist pattern including first portions having a larger thickness and second portions having a smaller thickness, and etching the electrode layers and the oxide semiconductor layers using the resist pattern as a mask. The fourth process includes removing the resist pattern in the second portions to provide uncovered portions and etching the electrode layers using the remaining resist pattern in the first portions as a mask. The fifth process includes forming a second insulating layer and patterning the second insulating layer. The sixth process includes reducing resistances of the oxide semiconductor layers in the uncovered portions. An example of the method is disclosed in Japanese Patent Publication No. 5599026.

The method of producing the thin film transistor substrate disclosed in the above Japanese Patent Publication includes reducing resistances of oxide semiconductor layers using holes in a second interlayer insulating layer. Resistances of portions of the oxide semiconductor layers overlapping opening edges of the second insulating layer are not reduced. Therefore, areas of the oxide semiconductor layers in which the resistances are reduced are reduced and thus areas to define pixel electrodes are reduced and a sufficiently high aperture rate cannot be achieved. Furthermore, if another film is formed over the holes in the second insulating layer, the film may have steps at the opening edges resulting in a problem.

SUMMARY

The technology described herein was made in view of the above circumstances. An object is to improve an aperture rate and to reduce unevenness.

A thin film transistor array substrate including thin film transistors (TFTs) includes gate electrodes of the TFTs, a first insulating film, channels of the TFTs, source electrodes of the TFTs, drain electrodes of the TFTs, pixel electrodes, a second insulating film, and a common electrode. The gate electrodes are constructed from a first metal film. The first insulating film is disposed on the first metal film. The channels are constructed from a semiconductor film disposed on the first insulating film and disposed to overlap the gate electrodes. The source electrodes are constructed from a second metal film disposed on the semiconductor film and connected to first ends of the channels. The drain electrodes are constructed from the second metal film and connected to second ends of the channels. The pixel electrodes include portions of the semiconductor film having reduced resistances and are connected to the drain electrodes. The second insulating film is disposed on the semiconductor film and the second metal film. The second insulating film includes sections overlapping the pixel electrodes without openings. The common electrode is constructed from a transparent electrode film disposed on the second insulating film and disposed to overlap at least the pixel electrodes.

A method of producing a thin film transistor array substrate including thin film transistors includes: forming a first metal film on a substrate; patterning the first metal film to define gate electrodes of the thin film transistors; forming a first insulting film on the first metal film; forming a semiconductor film on the first insulating film; patterning the semiconductor film to define channels of the thin film transistors at positions to overlap gate electrodes and to define pixel electrode portions to be connected to the thin film transistors; forming a second metal film on the semiconductor film; forming a photoresist film on the second metal film; exposing the photoresist film with a mask including transmissive area at positions overlapping source electrode portions and drain electrode portions of the second metal film to define source electrodes and the drain electrodes of the thin film transistors and semitransmissive area at positions overlapping inter-electrode portions of the second metal film between the source electrodes and the drain electrodes to form first thick portions under the transmissive area and second thick portions having a thickness less than a thickness of the first thick portions under the semitransmissive areas; developing the photoresist film to define the first thick portions and the second thick portions without overlapping the pixel electrode portions; removing portions of the second metal film not overlapping the photoresist film through etching; reducing resistances of the pixel electrode portions of the semiconductor film to define pixel electrodes; removing the second thick portions of the photoresist film after reducing the resistances of the pixel electrode portions; and removing the inter-electrode portions of the second metal film through etching.

According to the method described above, the resistances of the portions of the semiconductor film are reduced using the photoresist film that is provided for etching of the second metal film. In comparison to the known method in which the resistances of the portions of the oxide semiconductor layer overlapping the opening edges of the second insulating layer are not reduced, the resistance reduced portions of the semiconductor film and the pixel electrode portions increase. This method is preferable for improving the aperture rate. Furthermore, this method does not include forming openings in the second insulating layer for reducing the resistances. Therefore, even if another film is formed on the second metal film, unevenness of the other film on the second metal film is reduced. Still furthermore, in comparison to a method including forming and patterning a transparent electrode film for defining pixel electrodes, the number of photomasks can be reduced and thus the production cost can be reduced.

According to the technology described herein, the aperture rate improves and the unevenness is reduced.

DETAILED DESCRIPTION

First Embodiment

Figure 1:
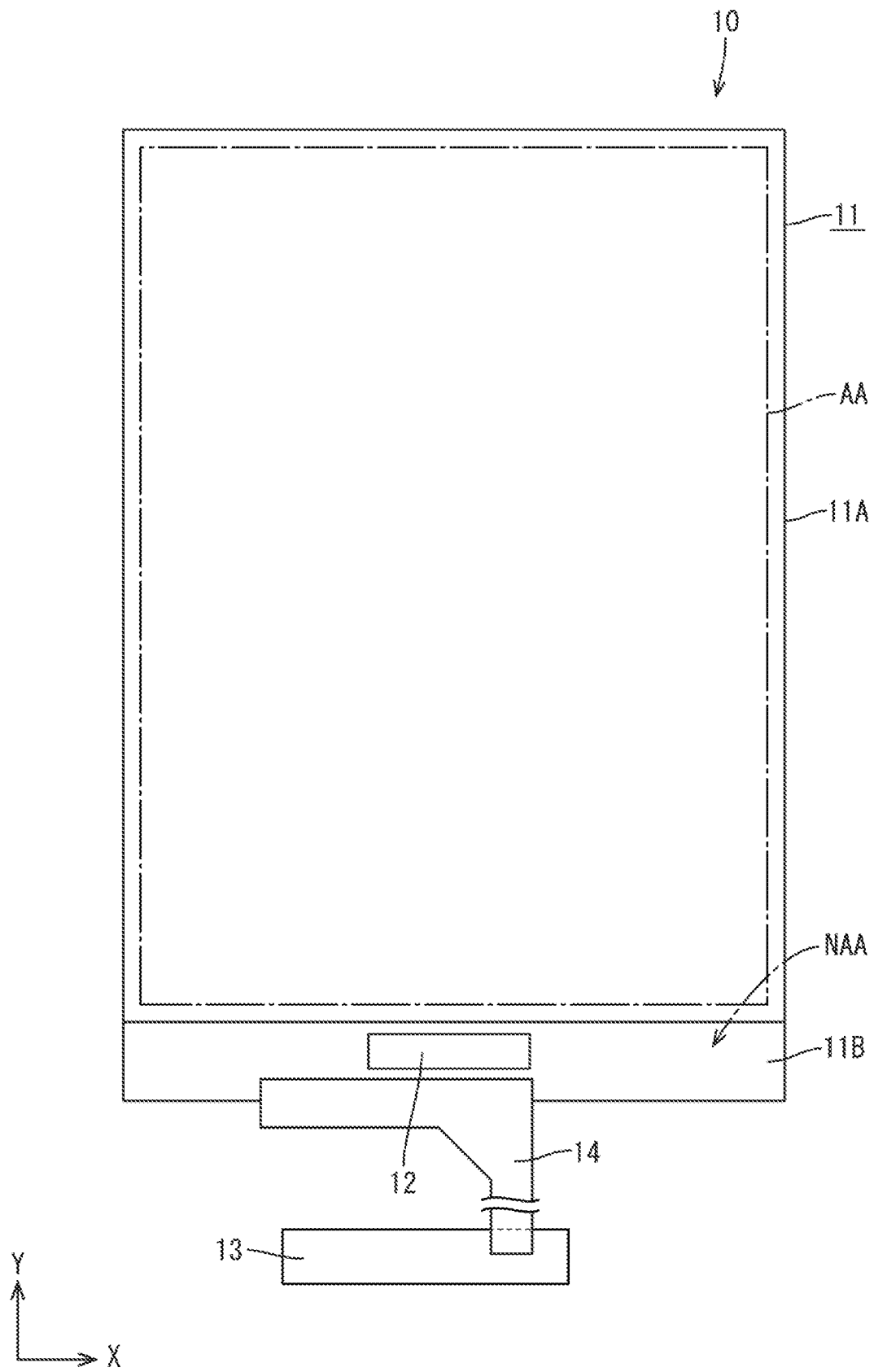
FIG. 1 is a schematic plan view illustrating connection between a flexible circuit board and a liquid crystal panel including a driver and connection between the flexible circuit board and a control circuit board according to a first embodiment.

A first embodiment will be described with reference to FIGS. 1 to 18. In this section, a liquid crystal panel 11 (a display panel) included in a liquid crystal display device 10 will be described. X-axes, Y-axes, and Z-axes may be present in the drawings. The axes in each drawing correspond to the respective axes in other drawings. The upper side and the lower side in FIGS. 3, 5, 6, and 8 to 18 correspond to a front side and a back side of the liquid crystal panel 11, respectively.

As illustrated in FIG. 1, the liquid crystal display device 10 includes the liquid crystal panel 11, a driver 12 (a panel driver, a drive circuit), a control circuit board 13 (an external signal source), a flexible circuit board 14 (an external component connector), and a backlight unit. The liquid crystal panel 11 is configured to display images. The driver 12 is configured to drive the liquid crystal panel 11. The control circuit board 13 is configured to supply various signals to the driver 12. The flexible circuit board 14 electrically connects the liquid crystal panel 11 to the control circuit board 13, which is a component disposed outside the liquid crystal panel 11. The backlight unit is an external light source disposed behind the liquid crystal panel 11. The backlight unit is configured to illuminate the liquid crystal panel 11 for image display. The driver 12 and the flexible circuit board 14 are mounted to the liquid crystal panel 11 via an anisotropic conductive film (ACF).

As illustrated in FIG. 1, the liquid crystal panel 11 has a vertically-long rectangular overall shape. An inner area of a plate surface of the liquid crystal panel 11 is defined as a display area (an active area) AA in which images are displayed. An outer area of the plate surface surrounding the display area AA is defined as a non-display area (an non-active area) NAA. The non-display area NAA has a frame shape in a plan view. A short direction, a long direction, and a thickness direction of the liquid crystal panel 11 correspond with the X-axis direction, the Y-axis direction, and the Z-axis direction in the drawings, respectively. In FIG. 1, a chain line indicates a boundary of the display area AA and an area outside the chain line is the non-display area NAA. The liquid crystal panel 11 includes at least a pair of substrates 11A and 11B and a liquid crystal layer including liquid crystal molecules that are held between the substrates 11A and 11B. The liquid crystal molecules have optical characteristic that vary according to application of electric field. One of the substrates 11A and 11B on the front side is a CF substrate 11A (a common substrate). The other one of the substrates 11A and 11B on the rear side (the back side) is an array substrate 11B (a thin film transistor array substrate, an active matrix substrate, a TFT array substrate). Polarizing plates are attached to outer surfaces of the substrates 11A and 11B, respectively.

Figure 2:
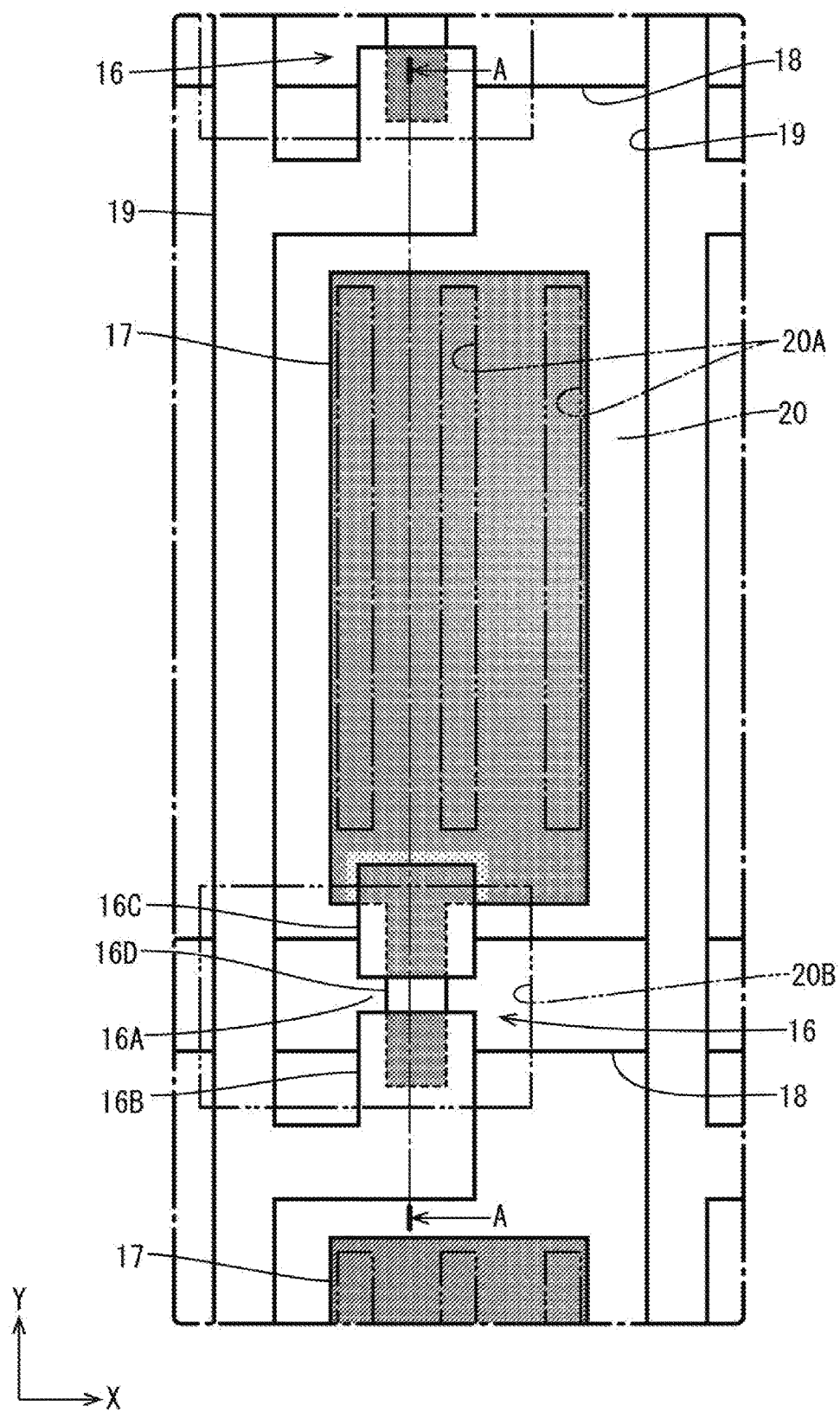
FIG. 2 is a plan view schematically illustrating a two-dimensional configuration of an array substrate included in the liquid crystal panel in a display area.

As illustrated in FIG. 2, thin film transistors (TFTs) 16 and pixel electrodes 17 are disposed in a matrix in an area of an opposed surface of the array substrate 11B in the display area AA. The opposed surface is an inner surface of the array substrate 11B opposed to the CF substrate 11A. Gate lines 18 (scanning lines) and source lines 19 (date lines, signal lines) are disposed in a grid to define rectangular areas in which the TFTs and the pixel electrodes 17 are disposed. The gate lines 18 are connected to gate electrodes 16A of the TFTs 16. The source lines 19 are connected to source electrodes 16B of the TFTs 16. The pixel electrodes 17 are connected to drain electrodes 16C of the TFTs 16. The TFTs 16 are driven based on the signals supplied to the gate lines 18 and the source lines 19. Application of voltages to the pixel electrodes 17 is controlled according to the driving of the TFTs 16. Each pixel electrode 17 is disposed in the corresponding rectangular area defined by the gate lines 18 and the source lines 19. A common electrode 20 is a solid pattern formed on the inner surface of the array substrate 11B in the display area AA to overlap the pixel electrodes 17. The common electrode 20 includes slits 20A at positions overlapping the pixel electrodes 17. The slits 20A extend along a long direction of the pixel electrodes 17. Three slits 20A are provided for each pixel electrode 17. The common electrode 20 includes TFT openings 20B at positions overlapping the TFTs 16. Each of the TFT openings 20B has a horizontally-long rectangular shape. When a potential difference is created between the pixel electrode 17 and the common electrode 20 that overlap each other, a fringe electric field (an oblique electric field) is generated around the slits 20A. The fringe electric filed includes components along the plate surface of the array substrate 11B and components in a normal direction to the plate surface of the array substrate 11B. Namely, the liquid crystal panel 11 operated in fringe field switching (FFS) mode. In the drawings, a direction in which the gate lines 18 extend corresponds with the X-axis direction and a direction in which the source lines 19 extend correspond with the Y-axis direction.

As illustrated in FIG. 2, each TFT 16 is disposed adjacent to the corresponding pixel electrode 17 to which the TFT 16 is connected with respect to the Y-axis direction in FIG. 2, more specifically, adjacent to the lower edge of the corresponding pixel electrode 17 in FIG. 2. The TFTs 16 include gate electrodes 16A that are portions of the gate lines 18 and source electrodes 16B that branch off the source lines 19. Each source electrode 16B extends from a section of the corresponding source line 19 closer to a section of the source line 19 across the corresponding gate line 18 in the Y-axis direction and on an opposite side from the corresponding pixel electrode 17 relative to the gate line 18. Each source electrode 16B has an L shape in a plan view. A distal end of each source electrode 16B is disposed to overlap the corresponding gate electrode 16A. Image signals are supplied to the source electrodes 16B and transmitted to the source lines 19. The TFTs 16 include drain electrodes 16C disposed away from the respective source electrodes 16B in the Y-axis direction. Each drain electrode 16C includes a first end that is opposed to the corresponding source electrode 16B and a second end that is disposed to overlap the corresponding pixel electrode 17 and connected to the pixel electrode 17. The TFTs 16 include channels 16D that overlap the respective gate electrodes 16A. A gate insulating film 26 is disposed between the gate electrodes 16A and the channels 16D. The channels 16D are connected to the respective source electrodes 16B and the respective drain electrodes 16C. The channels 16D extend in the Y-axis direction to overlap the respective gate electrodes 16A. Each channel 16D includes a first end connected to the corresponding source electrode 16B and a second end connected to the corresponding drain electrode 16C. When the TFTs 16 are driven based on the scan signals supplied to the gate electrodes 16A, the image signals (potentials) supplied to the source lines 19 are transmitted from the source electrodes 16B to the drain electrodes 16C via the channels 16D. As a result, the pixel electrodes 17 are charged to the potentials based on the image signals.

On a section of an inner surface of the CF substrate 11A in the display area AA, color filters are disposed in a matrix to be opposed to the pixel electrodes 17 on the array substrate 11B. The color filters include red (R), green (G), and blue (B) color filters that are repeatedly arranged in predefined sequence. Among the color filters, a light blocking film (a black matrix) is formed to reduce color mixture.

Figure 3:
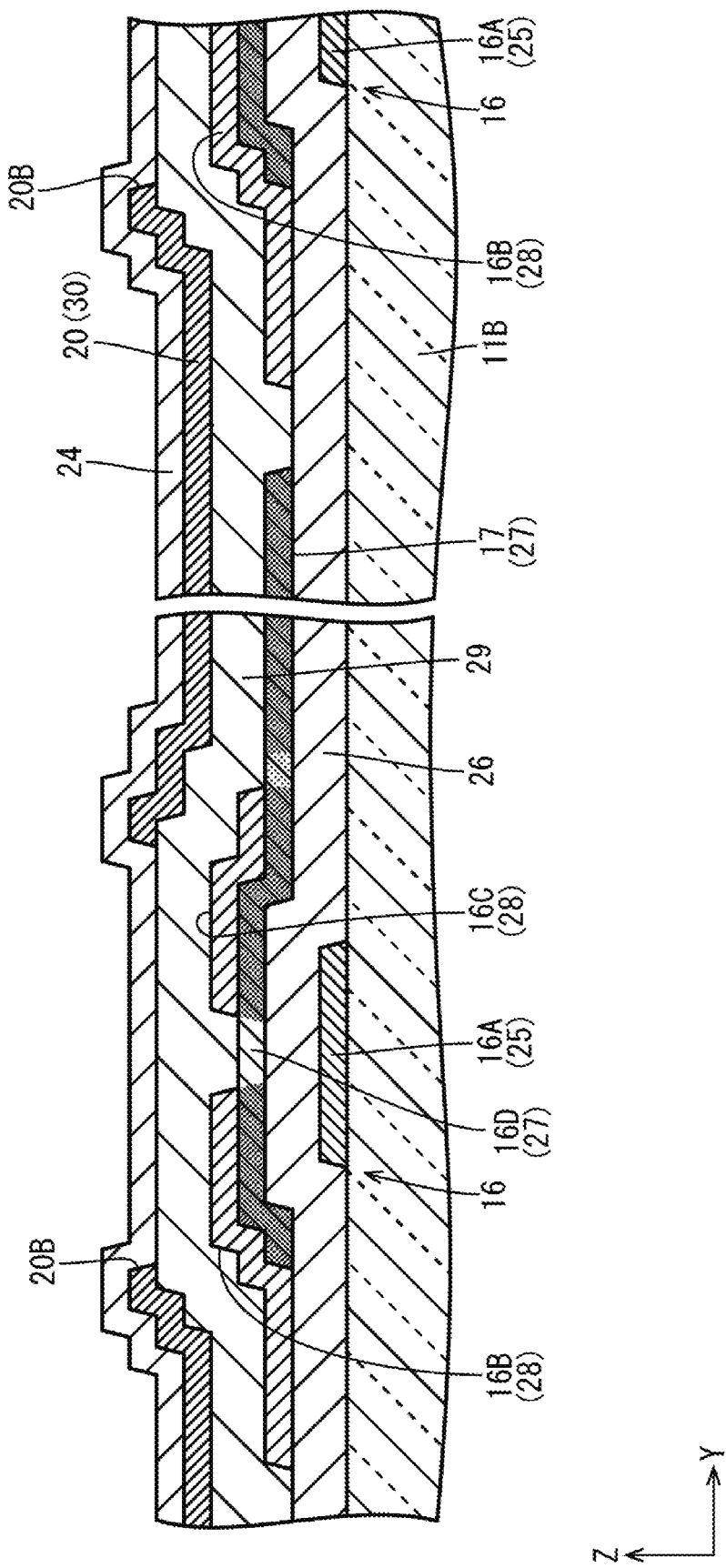
FIG. 3 is a cross-sectional view along line A-A in FIG. 2.

As illustrated in FIG. 3, an alignment film 24 is an innermost layer on the array substrate 11B (adjacent to the liquid crystal layer). The alignment film 24 is formed to contact the liquid crystal layer. An innermost layer on the CF substrate 11A is an alignment film that contacts the liquid crystal layer. The alignment film 24 and the other alignment film are for orientation of the liquid crystal molecules included in the liquid crystal layer. The alignment film 24 is made of polyimide and formed in a solid pattern within the plate surface of the array substrate 11B. The alignment film 24 may be a photo alignment film that can orientate the liquid crystal molecule with light in a specific wavelength range (e.g., ultraviolet rays) along a direction in which the light is applied. The alignment film on the CF substrate 11A has the same configuration as that of the alignment film 24.

The CF substrate 11A and the array substrate 11B include glass substrates and various layers formed on top of one another on inner surfaces of the glass substrates. As illustrated in FIG. 3, the array substrate 11B includes a first metal film 25 (a gate metal film), the gate insulating film 26 (a first insulating film), a semiconductor film 27, a second metal film 28 (a source metal film), an interlayer insulating film 29 (a second insulating film), a transparent electrode film 30, and the alignment film 24 formed in layers in this sequence from a lower layer side (a glass substrate side, a side farther from the liquid crystal layer).

The first metal film 25 is a multilayer metal film made of different kinds of metals of a single-layer film made of a single kind of metal. The gate lines 18 and the gate electrodes 16A of the TFTs 16 are constructed of the first metal film 25. The gate insulating film 26 is made of inorganic insulating material (inorganic resin) including silicon oxide ($SiO_2$) and silicon nitride ($SiN_x$). The semiconductor film 27 is an oxide semiconductor film made of material including oxide semiconductor. The channels 16D of the TFTs 16 connected to the source electrodes 16B and the drain electrodes 16C and the pixel electrodes 17 are constructed from the semiconductor film 27. An example of the material of the semiconductor film 27 is an In—Ga—Zn—O based semiconductor (e.g., indium gallium zinc oxide). The In—Ga—Zn—O based semiconductor is a ternary oxide containing indium (In), gallium (Ga), and zinc (Zn). Ratios of In, Ga, and Zn (compound ratios) may be, but not limited to, In:Ga:Zn=2:2:1, In:Ga:Zn=1:1:1, or In:Ga:Zn=1:1:2. The In—Ga—Zn—O based semiconductor may be amorphous or crystalline. A preferable crystalline In—Ga—Zn—O based semiconductor has a c-axis that is orientated substantial perpendicular to a surface of the layer. The second metal film 28 includes multiple metal layers made of different kinds of metals. The source electrodes 16B and the drain electrodes 16C of the TFTs 16 and the source lines 19 are constructed from the second metal film. The second metal film 28 has a two-layer structure including a first metal layer and a second metal layer. The first metal layer is made of titanium (Ti) and disposed below the second metal layer. The second metal layer is made of copper (Cu) and disposed above the first metal layer. The first metal layer may directly contact the semiconductor film 27. The second metal film 28 may have a three-layer structure that includes a first metal layer, a second metal layer, and a third metal layer. The first metal layer may be disposed in the lowermost layer. The second metal layer may be made of aluminum (Al) and disposed between the first metal layer and the third metal layer. The third metal layer may be made of molybdenum (Mo) and disposed in the uppermost layer. The interlayer insulating film 29 is made of inorganic interlayer insulating material similar to the gate insulating film 26. The interlayer insulating film 29 has a thickness about equal to the thickness of the gate insulating film 26. The transparent electrode film 30 is made of transparent electrode material (e.g., indium tin oxide). The common electrode 20 is constructed from the transparent electrode film 30.

As illustrated in FIGS. 2 and 3, the pixel electrodes 17 are prepared by reducing resistances in portions of the semiconductor film 27 in the production process. The pixel electrodes 17 (resistance reduced portions of the semiconductor film 27) has the resistances about 1/10000000000 to 1/100 of the resistance of resistance non-reduced portions of the semiconductor film 27 (the channels 16D). Namely, the pixel electrodes 17 function as conductors. The semiconductor film 27 including the reduced resistance portions is made of substantially transparent light transmissive material. Therefore, the pixel electrodes 17 have sufficient levels of clearness and light transmissivity. Portions of the semiconductor film 27 between the portions of the semiconductor film 27 overlapping the drain electrodes 16C and the pixel electrodes 17 have resistances greater than those of the pixel electrodes 17 but less than those of the resistance non-reduced portions of the semiconductor film 27. The portions are referred to as transition portions. In the resistance non-reduced portions of the semiconductor film 27, charge transfer occurs only under a specific condition (when the scan signals are supplied to the gate electrodes 16A). However, charge transfer is always possible in transition portions, that is, the transition portions function substantially as conductors. In FIGS. 2 and 3, the resistance reduced portions of the semiconductor film 27 are in deeper shade and the transition portions of the semiconductor film 27 are in lighter shade.

The first metal layer that contacts the semiconductor film 27 and is included in the second metal film 28 is made of titanium. In comparison to molybdenum (Mo) or indium zinc oxide (IZO), titanium is more likely to take oxygen from the semiconductor film and to be oxidized. Resistances of portions of the semiconductor film 27 overlapping the source electrodes 16B and the drain electrodes 16C of the second metal film 28 are reduced over time as the oxygen is taken by titanium in the first metal layer. The portions are thus provided as resistance reduced portions. The charge transfer is more likely to occur between the channels 16D and the source electrodes 16B or the drain electrodes 16C or between the drain electrodes 16C and the pixel electrodes 17. Therefore, on-state currents increase.

As illustrated in FIG. 3, the interlayer insulating film 29 does not include openings in sections overlapping the pixel electrodes 17. Namely, the interlayer insulating film 29 covers entire areas of the pixel electrodes 17 from the upper side and entire areas of the TFTs 16 from the upper side. The pixel electrodes 17 are formed by reducing the resistances of the portions of the semiconductor film 27. The interlayer insulating film 29 disposed in the layer upper than the semiconductor film 27 and the second metal film 28 does not include the openings in the sections overlapping the pixel electrodes 17. In the known production process, resistances of portions of an oxide semiconductor layer are reduced using openings formed in a second insulating film. Resistances of portions of the oxide semiconductor film overlapping opening edges of the openings in the second interlayer insulating layer (peripheral edges of the pixel electrodes) are not reduced. In comparison to the known production process, the resistance reduced portions of the semiconductor film 27 increases and thus the areas to define the pixel electrodes 17 increase. It is preferable for improving the aperture ratio. The interlayer insulating film 29 does not include the openings in the sections overlapping the pixel electrodes 17. Therefore, the common electrode 20 constructed from the transparent electrode film 30 disposed on the interlayer insulating film 29 is less likely to have steps. According to the configuration, wettability of the alignment film 24 applied to the surface of the common electrode 20 improves. Furthermore, the number of photomasks can be reduced in comparison to the process in which the pixel electrodes 17 are formed by forming a transparent electrode film separately from the transparent electrode film 30 from which the common electrode 20 is constructed and by patterning the transparent electrode film. Therefore, the production cost can be reduced.

Figure 4:
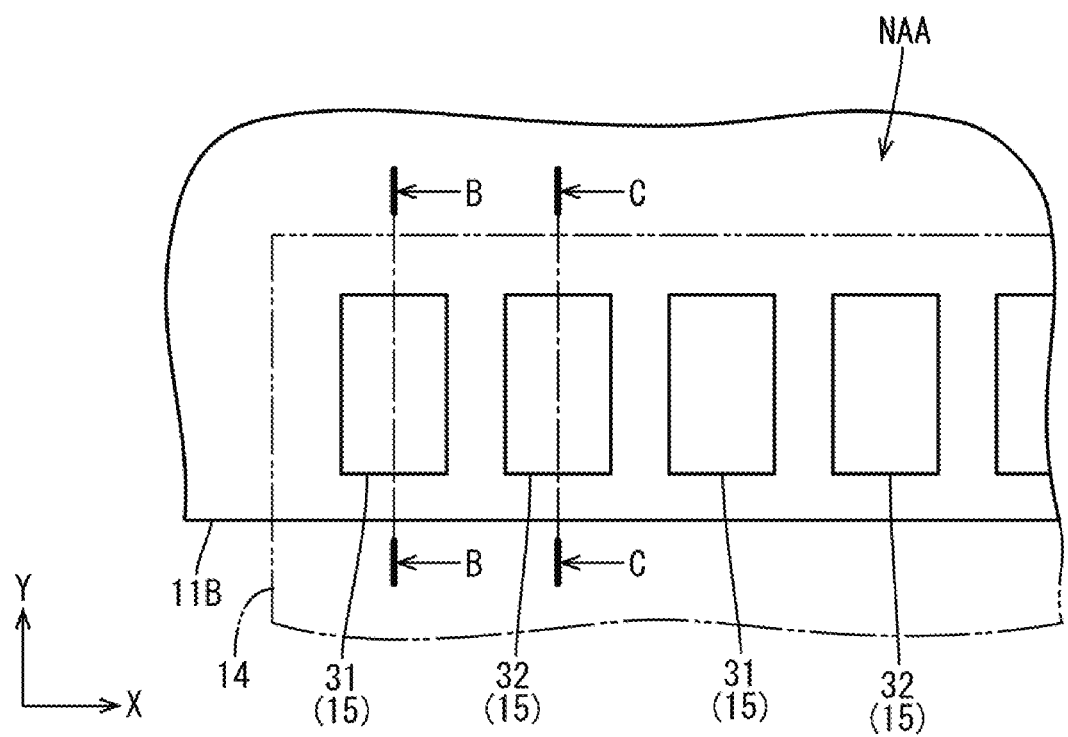
FIG. 4 is a plan view illustrating terminals disposed in a mounting area of the liquid crystal panel in which the flexible circuit board is mounted.
Figure 5:
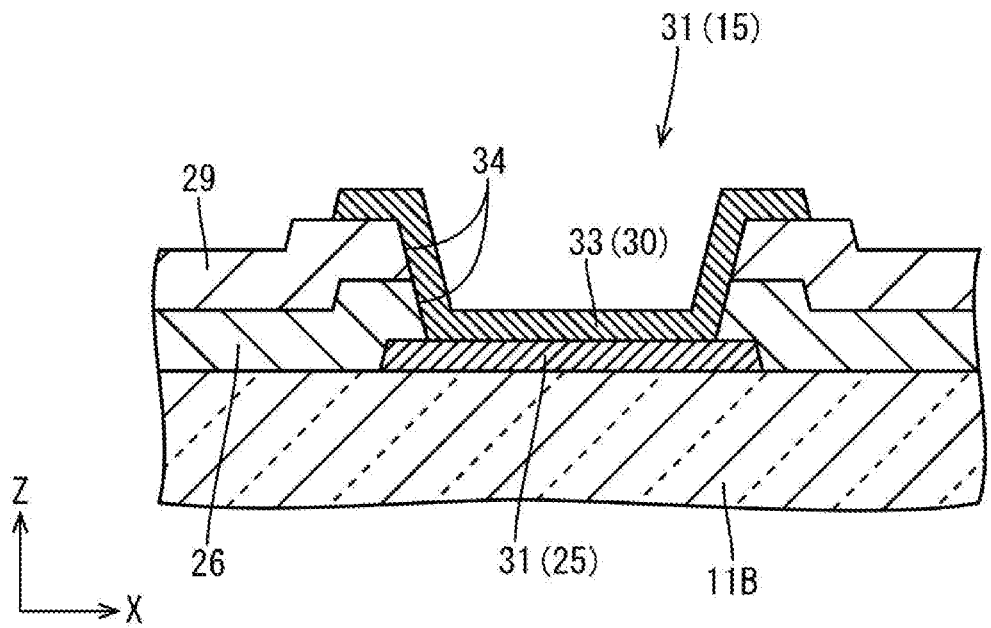
FIG. 5 is a cross-sectional view along line B-B in FIG. 4.
Figure 6:
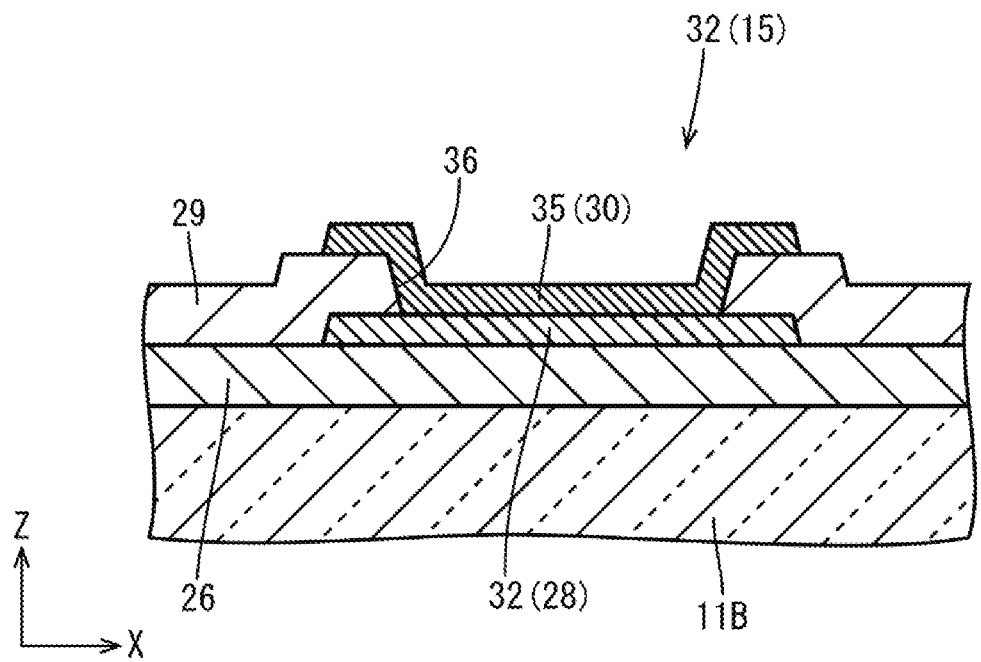
FIG. 6 is a cross-sectional view along line C-C in FIG. 4.

As illustrated in FIG. 4, terminals 15 are disposed in the mounting areas of the liquid crystal panel 11 to which the driver 12 and the flexible circuit board 14 are mounted. The terminals 15 are electrically connected to terminals of the driver 12 and the flexible circuit board 14 via the ACF. The terminals 15 will be described with reference to FIGS. 4 to 6. In FIG. 4, the terminals 15 disposed in the mounting area of the liquid crystal panel 11 to which the flexible circuit board 14 is mounted among the terminals 15 are illustrated. A two-dashed chain line in FIG. 4 indicates an outline of the flexible circuit board 14. The terminals 15 are arranged at intervals along the X-axis direction on the array substrate 11B in the mounting areas to which the driver 12 and the flexible circuit board 14 are mounted. Each terminal 15 has a vertically-long rectangular shape in a plan view. The terminals 15 are constructed from the first metal film 25 and the second metal film 28 included in the array substrate 11B. The terminals 15 include first terminals 31 constructed from the first metal film 25 and second terminals 32 constructed from the second metal film 28. One of the first terminals 31 is illustrated in FIG. 5 and one of the second terminals 32 is illustrated in FIG. 6. The first terminals 31 are covered with first terminal protectors 33 that are constructed from the transparent electrode film 30. The gate insulating film 26 and the interlayer insulating film 29 disposed between the first metal film 25 and the transparent electrode film 30 include first terminal contact holes 34 that pass entirely through sections of the gate insulating film 26 and the interlayer insulating film 29 in a thickness direction thereof at positions overlapping the first terminals 31 and the first terminal protectors 33. The first terminal protectors 33 are connected to the first terminals 31 via the first terminal contact holes 34. The second terminals are covered with second terminal protectors 35 that are constructed from the transparent electrode film 30. The interlayer insulating film 29 disposed between the second metal film 28 and the transparent electrode film 30 include second terminal contact holes 36 that pass entirely through the interlayer insulating film 29 in a thickness direction thereof at positions overlapping the second terminals 32 and the second terminal protectors 35. The second terminal protectors 35 are connected to the second terminals 32 via the second terminal contact holes 36.

Figure 7:
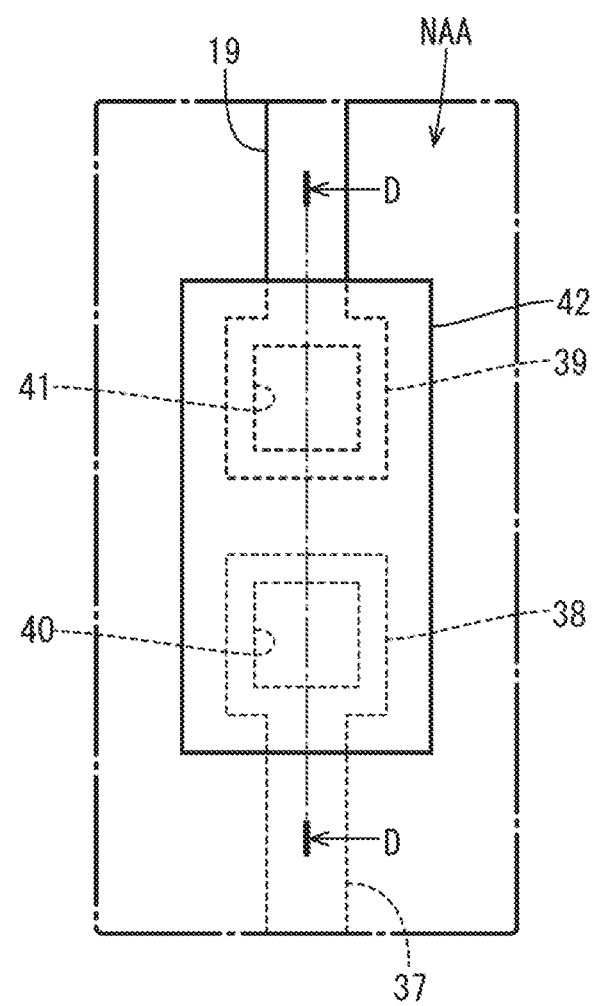
FIG. 7 is a plan view of a section of an array substrate in a non-display area included in the liquid crystal panel including a connecting point of a source line and source lead lines and therearound.
Figure 8:
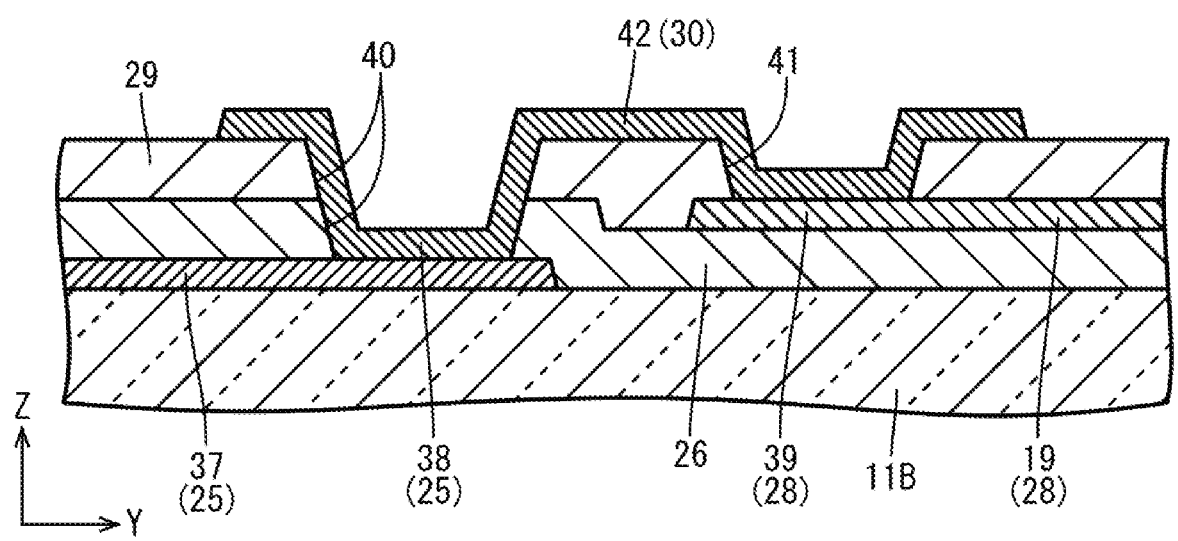
FIG. 8 is a cross-sectional view along line D-D in FIG. 4.

Source lead lines 37 that connect the terminals 15 disposed on the array substrate 11B in the mounting area to which the driver 12 is mounted to the source lines 19 will be described with reference to FIGS. 7 and 8. The source lead lines 37 are disposed on the array substrate 11B between the display area AA and the mounting area to which the driver 12 is mounted in the non-display area NAA. First ends of the source lead lines 37 are connected to the source lines 19 and second ends of the source lead lines 37 are connected to the terminals 15 disposed in the mounting area to which the driver 12 is mounted. Ends of the source lines 19 (second contacts 39) are drawn from the display area AA to the mounting area to which the driver 12 is mounted in the non-display area NAA. As illustrated in FIGS. 7 and 8, the source lead lines 37 are constructed from the first metal film 25. Ends of the source lead lines 37 are defined as first contacts 38. The source lines 19 constructed from the second metal film 28 include ends on the source lead line 37 side defined as second contacts 39. The second contacts 39 are disposed not to overlap the first contacts 38. The gate insulating film 26 and the interlayer insulating film 29 include first contact holes 40 and second contact holes 41 that pass entirely through sections of the gate insulating film 26 and the interlayer insulating film 29 in a thickness direction thereof. The first contact holes 40 are located at positions overlapping the first contacts 38. The second contact holes 41 are located at positions overlapping the second contacts 39. Connectors 42 constructed from the transparent electrode film 30 are connected to the first contacts 38 and the second contacts 39. Each connector 42 extends to cross the corresponding first contact hole 40 and the corresponding second contact hole 41. A first end and a second end of each connector 42 are connected to the corresponding first contact 38 via the corresponding first contact hole 40 and the corresponding second contact 39 via the corresponding second contact hole 41, respectively.

The liquid crystal panel 11 has the configuration described above. Next, the method of producing the liquid crystal panel 11 will be described. The liquid crystal panel 11 is prepared by bonding the CF substrate 11A and the array substrate 11B together. The CF substrate 11A and the array substrate 11B are separately produced. A method of producing the array substrate 11B included in the liquid crystal panel 11 will be described in detail.

The method of producing the array substrate 11B includes a first metal film forming process, a gate insulating film forming process (a first insulating film forming process), a semiconductor film forming process, a second metal film forming process, a photoresist film forming process, a first etching process, a resistance reducing process, a second thick portion removing process, a second etching process, a photoresist film removing process, an interlayer insulating film forming process (a second insulating film forming process), and a transparent electrode film forming process. The first metal film forming process includes forming the first metal film 25 and patterning the first metal film 25. The gate insulating film forming process includes forming the gate insulating film 26. The semiconductor forming process includes forming the semiconductor film 27 and the patterning the semiconductor film 27. The second metal film forming process includes forming the second metal film 28. The photoresist film forming process includes forming a photoresist film 44 and patterning the photoresist film 44. The first etching process includes etching the second metal film 28 using the photoresist film 44. The resistance reducing process includes reducing resistances of the portions of the semiconductor film 27 not covered with the photoresist film 44. The second thick portion removing process includes removing second thick portions 44B of the photoresist film 44. The second etching process includes etching the second metal film 28 using the photoresist film 44 that does not include the second thick portions 44B. The photoresist removing process includes removing the photoresist film 44. The interlayer insulating film forming process includes forming the interlayer insulating film 29 and patterning the interlayer insulating film 29. The transparent electrode film forming process includes forming the transparent electrode film 30 and patterning the transparent electrode film 30. The processes will be described in detail with reference to FIGS. 9 to 18.

Figure 9:
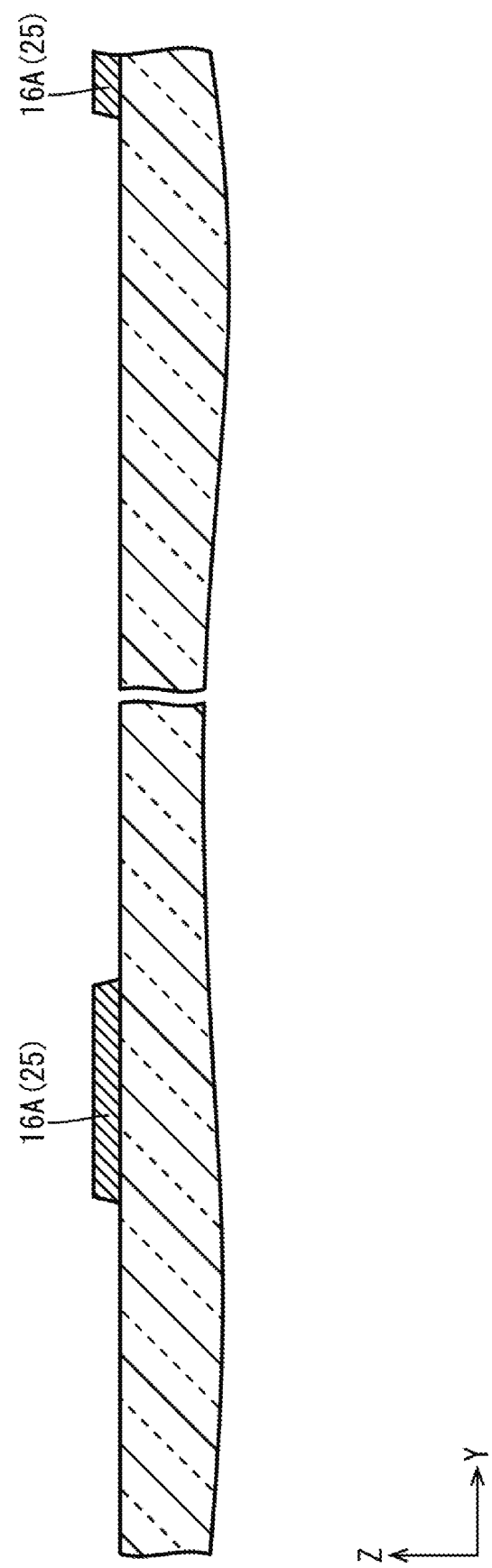
FIG. 9 is a cross-sectional view illustrating gate electrodes constructed from a first metal film in a first metal film forming process.
Figure 10:
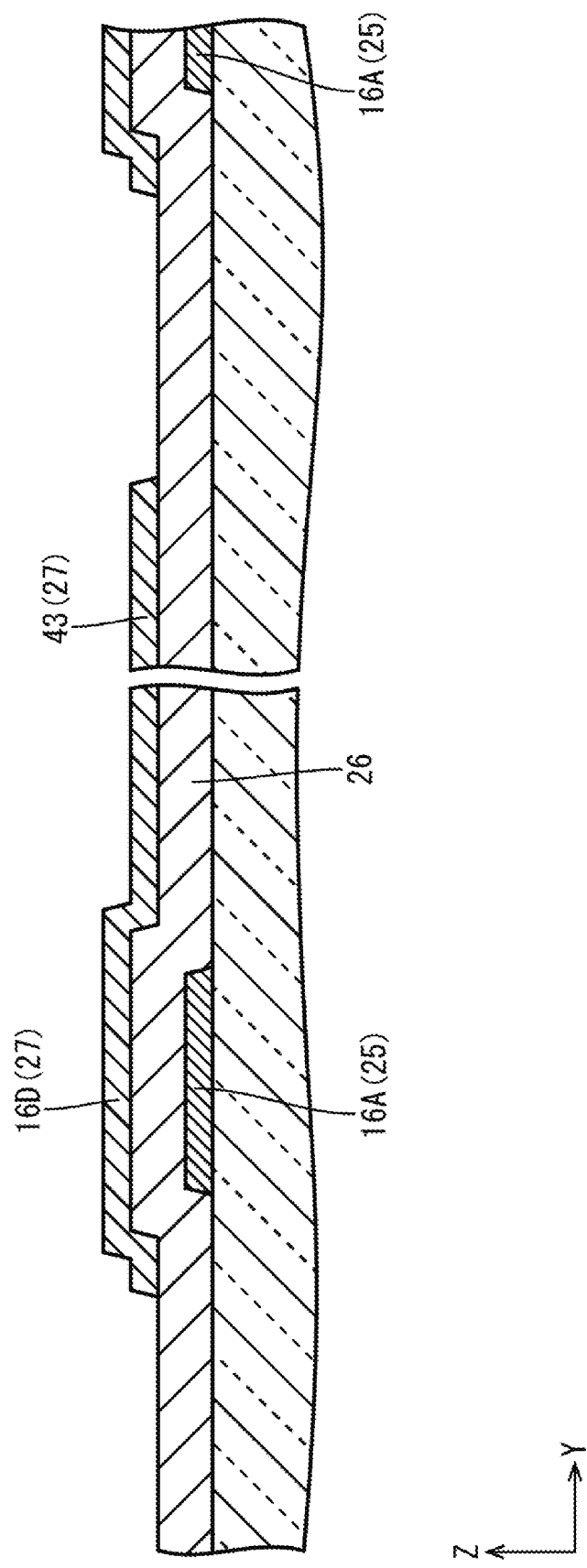
FIG. 10 is a cross-sectional view illustrating a gate insulating film formed in a gate insulating film forming process and a semiconductor film formed on the gate insulating film and patterned in a semiconductor film forming process.

As illustrated in FIG. 9, in the first metal film forming process, the first metal film 25 is formed on a surface of a glass substrate included in the array substrate 11B and patterned using a photomask including a predefined pattern to define the gate electrodes 16A, the first terminals 31 (see FIG. 5), and the source lead lines 37 (see FIG. 8). In the gate insulating film forming process, the gate insulating film is formed on the surface of the glass substrate and the first metal film 25. As illustrated in FIG. 10, in the semiconductor film forming process, the semiconductor film 27 is formed on the gate insulating film 26 and patterned using a photomask including a predefined pattern. When the patterning is completed, at least channels 16D and the pixel electrode portions 43 are constructed from the semiconductor film 27. The channels 16D overlap the gate electrodes 16A. The pixel electrode portions 43 are formed into the pixel electrodes 17 in the resistance reducing process. In the second metal film forming process, the second metal film 28 is formed on the gate insulating film 26 and the semiconductor film 27 (see FIG. 11). In the second metal film forming process, multiple metal films are formed to form the second metal film 28. The first metal layer that contacts the semiconductor film 27 is made of titanium.

Figure 11:
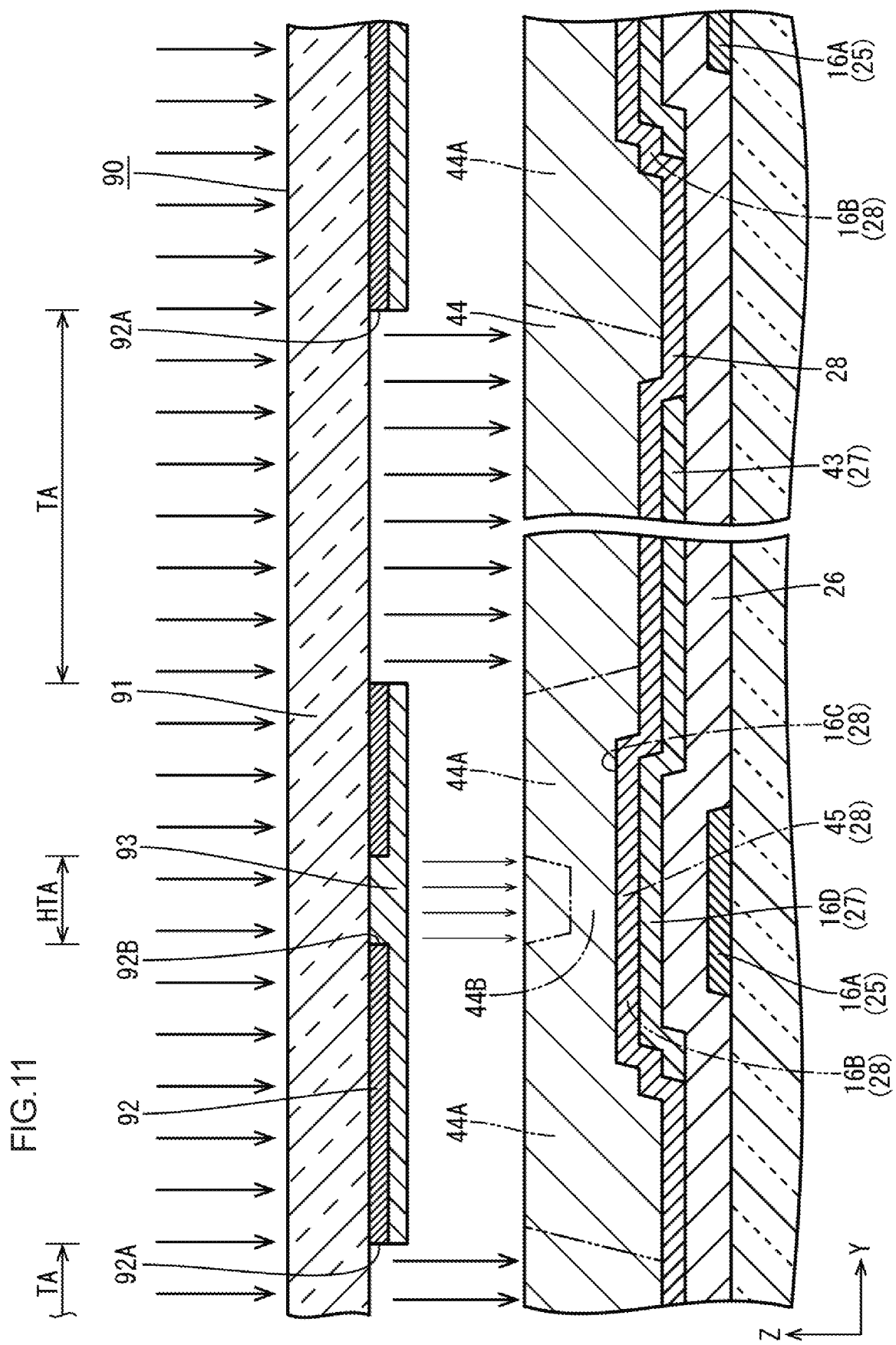
FIG. 11 is a cross-sectional view illustrating a second metal film formed in a second metal film forming process and a photoresist film formed on the second metal film and exposed using a halftone mask in a photoresist film forming process.
Figure 12:
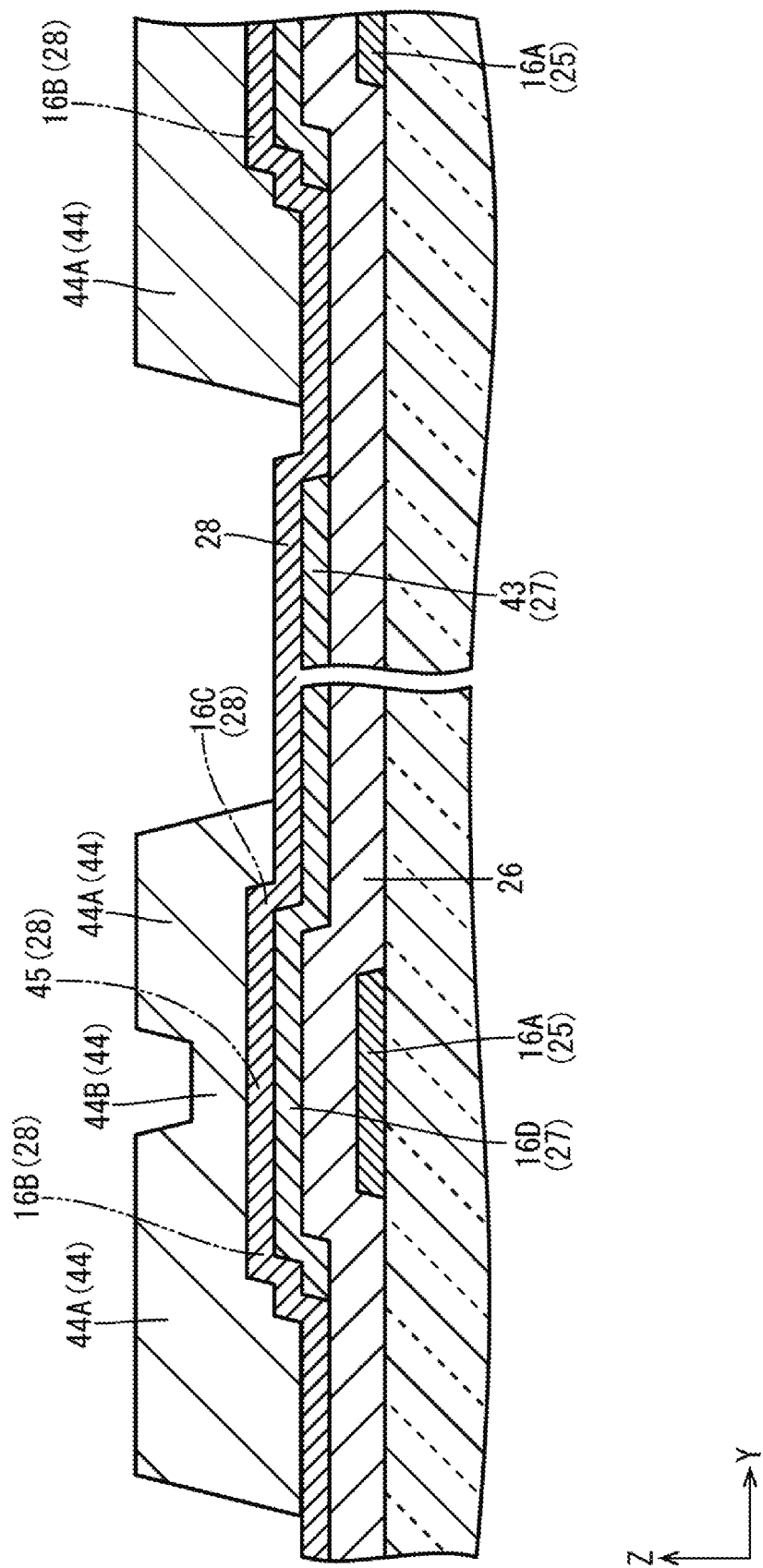
FIG. 12 is a cross-sectional view illustrating the photoresist film developed in the photoresist film forming process.

As illustrated in FIG. 11, in the photoresist film forming process, the photoresist film 44 is formed on the second metal film 28 and patterned. The photoresist film 44 is made of positive-type photosensitive material. To pattern the photoresist film 44, the photoresist film 44 is exposed using a halftone mask 90 including transmissive areas TA and semitransmissive area HTA and developed. The halftone mask 90 will be described. The halftone mask 90 includes a transparent glass substrate 91, a light blocking film 92, and a semitransmissive film 93. The light blocking film 92 is formed on a plate surface of the glass substrate 91. The light blocking film 92 blocks exposure light from a light source in an exposing device. The semitransmissive film 93 is disposed on the light blocking film 92 away from the glass substrate 91. The semitransmissive film 93 passes the exposure light from the light source at a predefined passing rate. A passing rate of the light blocking film 92 to pass the exposure light is about 0%. The passing rate of the semitransmissive film 93 is in a range from 10% to 70%. The light blocking film 92 includes first openings 92A and second openings 92B. The first openings 92A are located at positions not overlapping the semitransmissive film 93. The second openings 92B are located at positions overlapping the semitransmissive film 93. The first openings 92A are referred to as the transmissive areas TA that pass the exposure light at the passing rate of about 100%. The second openings 92B are referred to as the semitransmissive areas HTA that pass the exposure light at the passing rate in the range from 10% to 70%. An area in which the light blocking film 92 is formed is referred to as a light blocking area with the passing rate of about 0%. The light blocking film 92 is disposed to overlap source line portions, source electrode portions, and drain electrode portions of the second metal film 28 to define the source lines 19, the source electrodes 16B, and the drain electrodes 16C. The first openings 92A are arranged to overlap the pixel electrode portions 43 of the semiconductor film (portions of the semiconductor film 27 to define the pixel electrodes 17). The second openings 92B are arranged to overlap the portions of the second metal film 28 to define inter-electrode portions 45 between the source electrodes 16B and the drain electrodes 16C. The inter-electrode portions 45 are structures that exist only in the production process. The photoresist film 44 is exposed and developed via the halftone mask 90 having the configuration described above. As illustrated in FIG. 12, the photoresist film 44 includes first thick portions 44A and the second thick portions 44B. The first thick portions 44A are portions of the photoresist film 44 exposed via the transmissive areas TA at positions overlapping the source electrode portions and the drain electrode portions of the second metal film 28 to define the source electrodes 16B and the drain electrodes 16C. The second thick portions 44B are portions of the photoresist film 44 exposed via the semitransmissive areas HTA at positions overlapping the portions of the second metal film 28 to define the inter-electrode portions 45. The second thick portions 44B have a thickness less (smaller) than the thickness of the first thick portions 44A. The photoresist film 44 does not overlap the pixel electrode portions 43 of the semiconductor film 27. The photoresist film 44 further includes source line overlapping portions having a thickness about equal to the thickness of the first thick portions 44A at positions overlapping the portions of the second metal film 28 to define the source lines 19.

Figure 13:
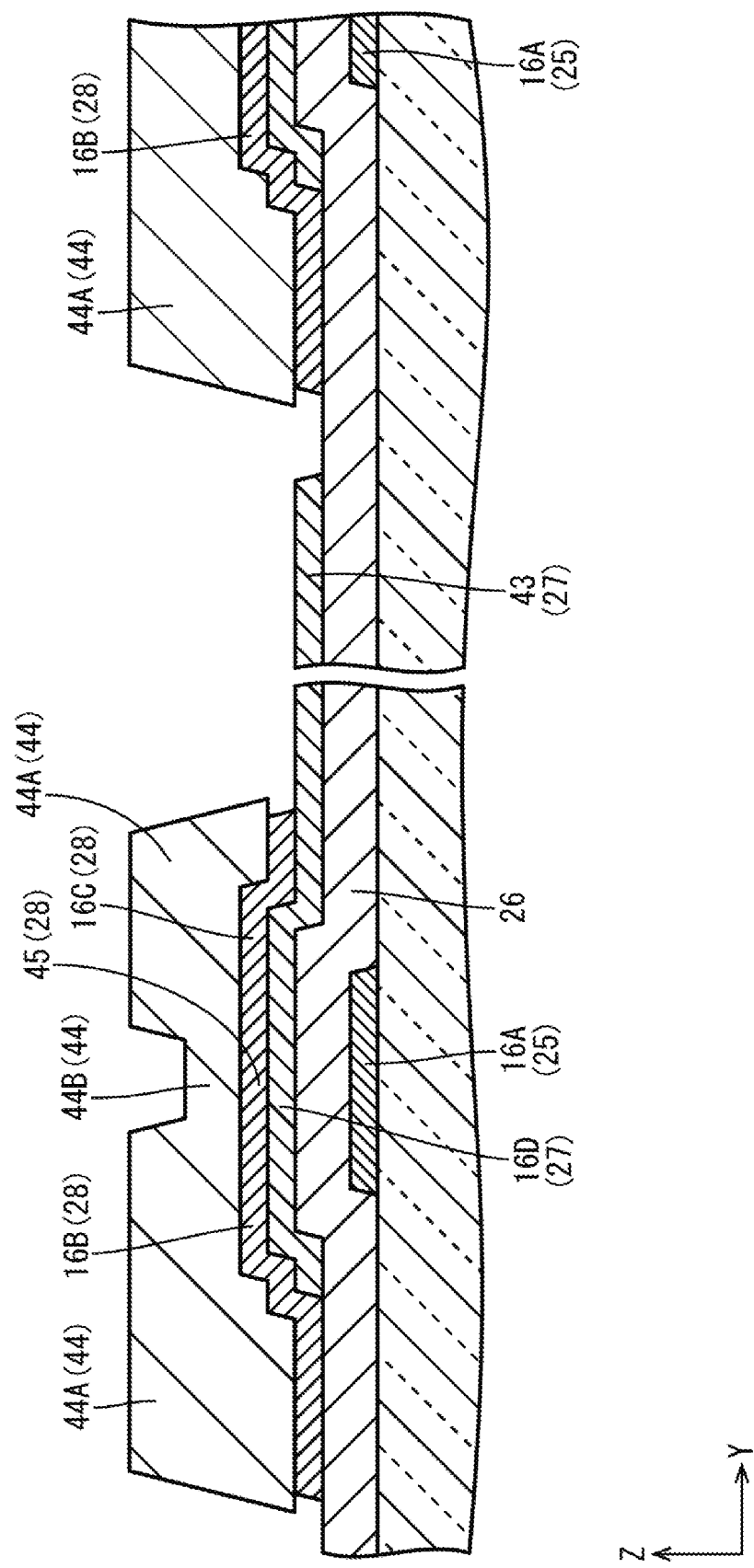
FIG. 13 is a cross-sectional view illustrating the second metal film etched using the photoresist film in a first etching process.
Figure 14:
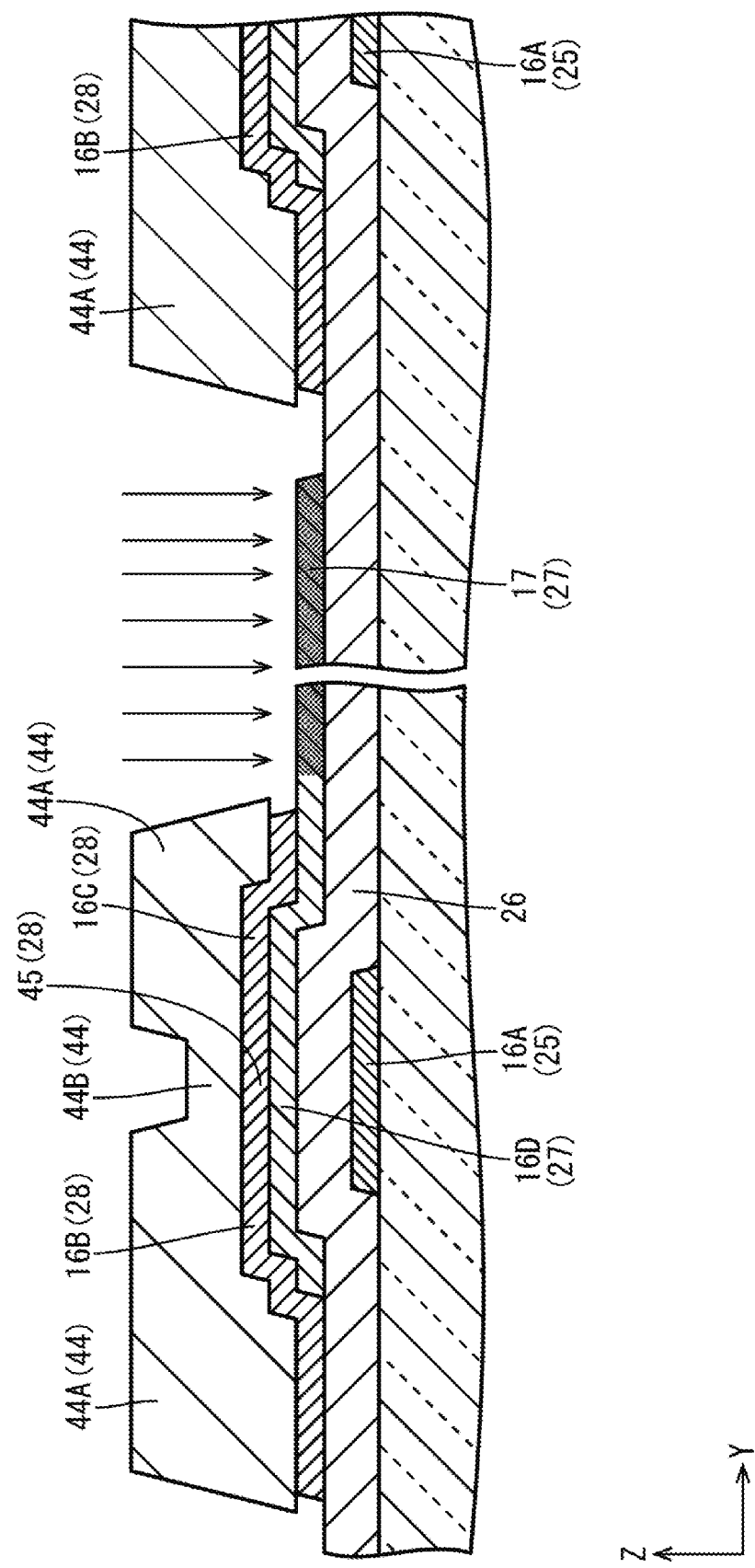
FIG. 14 is a cross-sectional view illustrating a resistance reducing process for reducing a resistance of a pixel electrode portion of the semiconductor film uncovered with the photoresist film.
Figure 15:
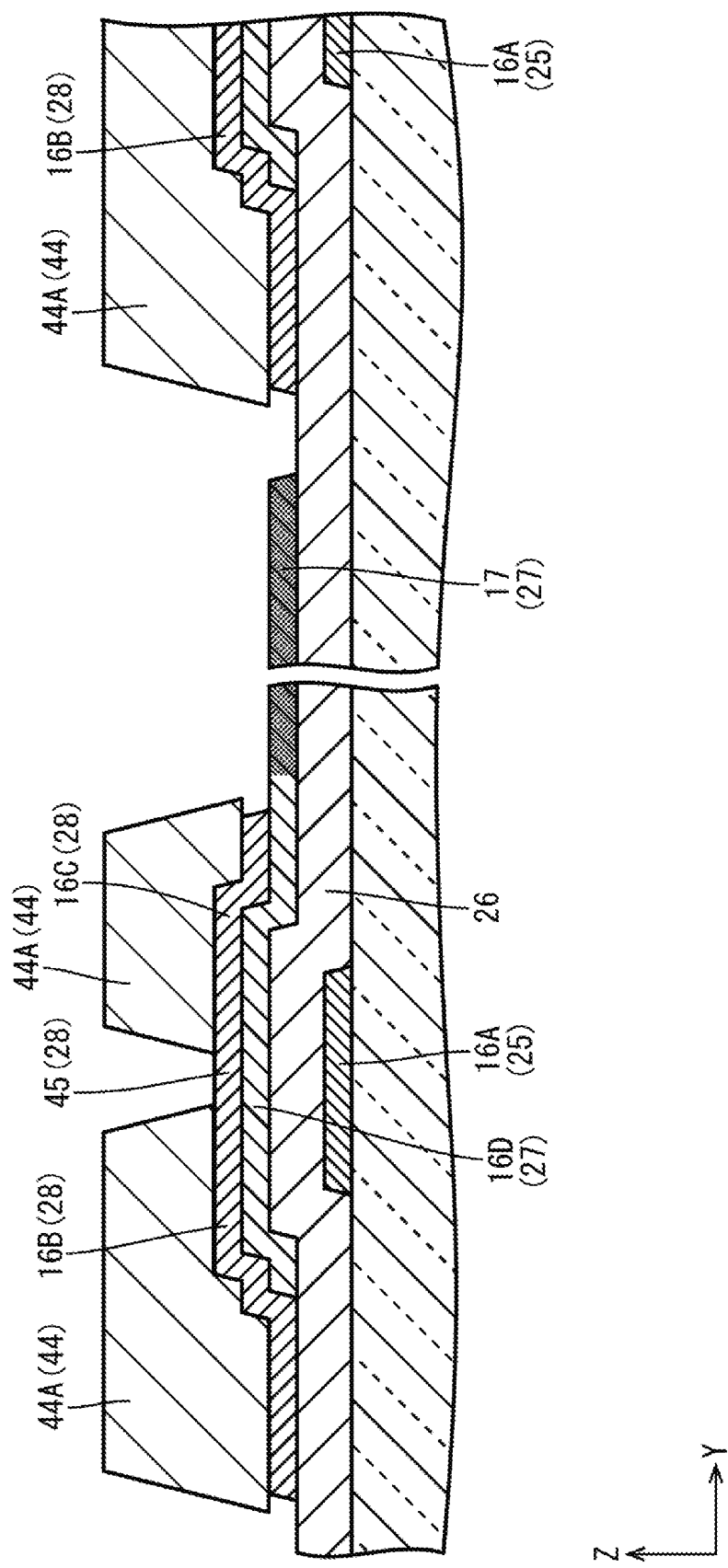
FIG. 15 is a cross-sectional view illustrating the array substrate from which a second thick portion of the photoresist film is removed in a second thick portion removing process.

As illustrated in FIG. 13, in the first etching process, the portions of the second metal film 28 not covered with the photoresist film 44, that is, the source line overlapping portions and portions not overlapping the first thick portions 44A and the second thick portions 44B are removed through etching. Through the first etching process, the source lines 19, the source electrodes 16B, the drain electrodes 16C, and the inter-electrode portions 45 are formed. Furthermore, the pixel electrode portions 43 of the semiconductor film 27 are exposed without covered with the photoresist film 44. As illustrated in FIG. 14, in the resistance reducing process, the resistances of the source line overlapping portions, the first thick portions 44A, the second thick portions 44B, and the pixel electrode portions 43 not overlapping the second metal film 28 are reduced. Plasma processing using NH3, H2, N2, or He gas may be preferable for the resistance reducing process. The pixel electrode portions 43 are configured as resistance reduced portions and the pixel electrodes 17 are prepared. As illustrated in FIG. 15, in the second thick portion removing process, ashing processing is performed on the photoresist film 44 to remove the second thick portions 44B of the photoresist film 44 having the less thickness. The ashing processing may have an effect entirely on the photoresist film 44. Therefore, the thicknesses and the areas of the source line overlapping portions and the first thick portions 44A are reduced. As a result, the source lines 19 constructed from the second metal film 28 are covered with the source line overlapping portions. The source electrodes 16B and the drain electrodes 16C constructed from the second metal film 28 are covered with the first thick portions 44A. The inter-electrode portions 45 constructed from the second metal film 28 are exposed without covered with the photoresist film 44. Because the second thick portion removing process is performed after the resistance reducing process, the inter-electrode portions 45 are covered with the second thick portions 44B in the resistance reducing process. Namely, the resistance reducing process does not have an effect on the inter-electrode portions 45. Furthermore, the resistance reducing process does not have an effect on the source electrodes 16B and the drain electrodes 16C adjacent to the inter-electrode portions 45.

Figure 16:
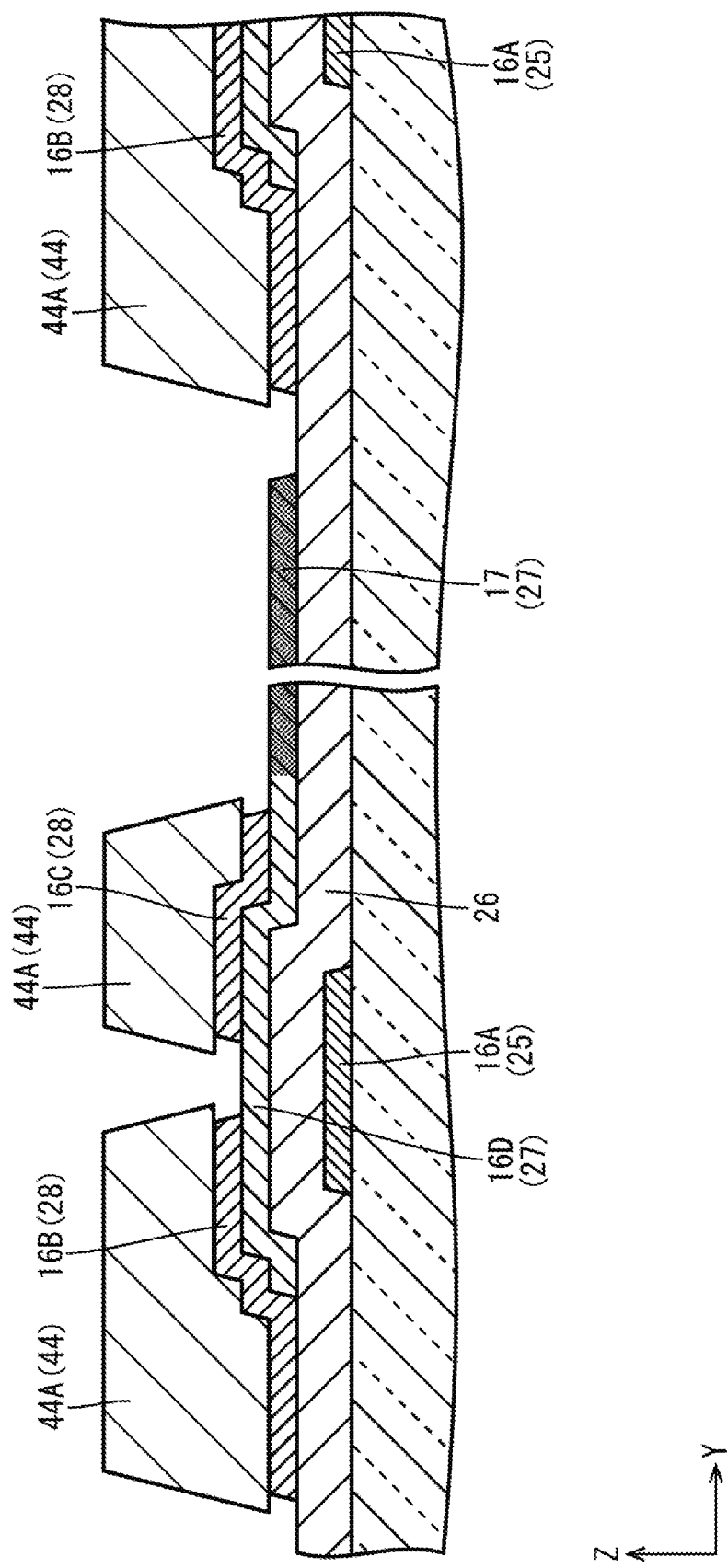
FIG. 16 is a cross-sectional view illustrating the second metal film etched using the photoresist film in a second etching process.

As illustrated in FIG. 16, in the second etching process, the inter-electrode portions 45 of the second metal film 28 not overlapping the first thick portions 44A of the photoresist film 44 are removed through etching. As a result, the source electrodes 16B and the drain electrodes 16C that are separated from each other are prepared. The metal layer of the second metal film 28 in contact with the semiconductor film 27 is made of titanium. In the first etching process and the second etching process, the metal layer is etched using a dry etching method. According to the method, accuracy in shaping the ends of the source electrodes 16B and the drain electrodes 16C improves. The metal layer made of titanium and in contact with the semiconductor film 27 tends to take oxygen from the semiconductor film 27 and thus the resistance of the semiconductor film 27 tends to decrease. In the production of the array substrate 11B, the reduction in resistance of the semiconductor film 27 due to titanium is less likely to occur and thus the channels 16D overlapping the inter-electrode portions 45 are the resistance non-reduced portions.

Figure 17:
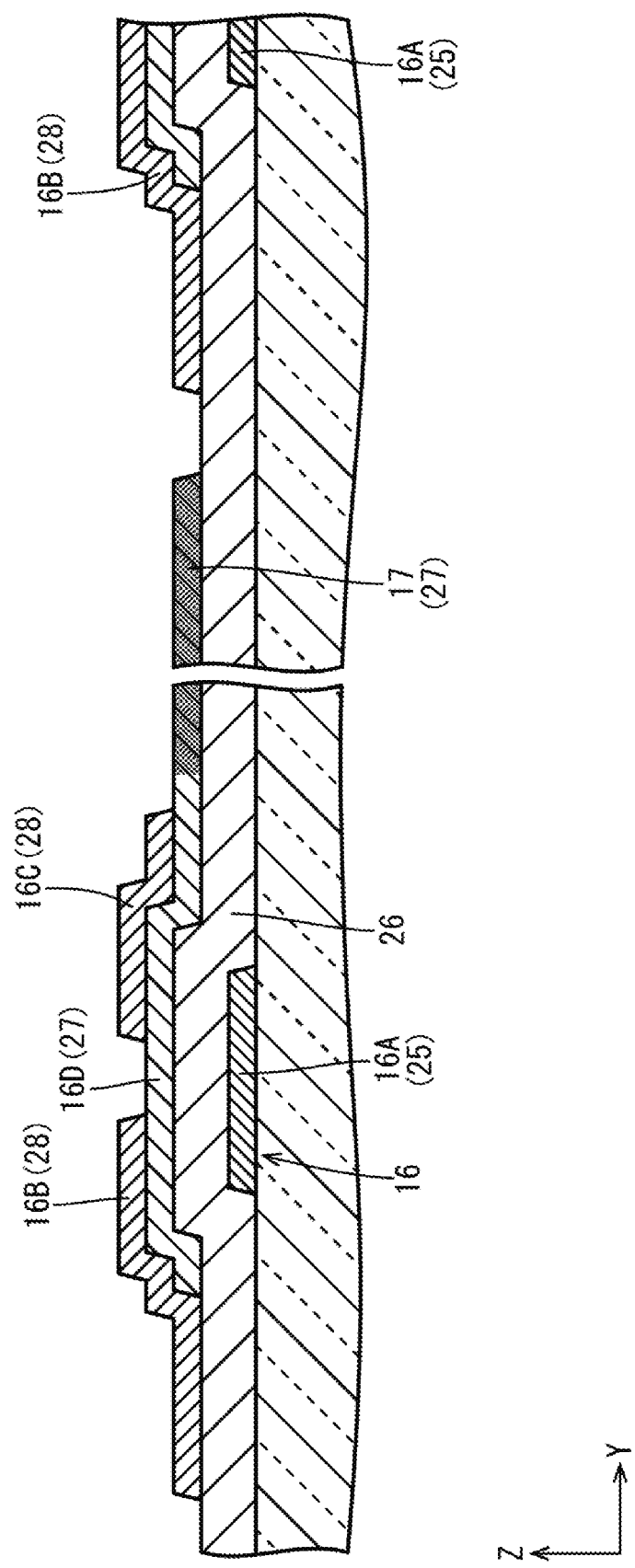
FIG. 17 is a cross-sectional view illustrating the array substrate from which the photoresist film is removed in a photoresist removing process.
Figure 18:
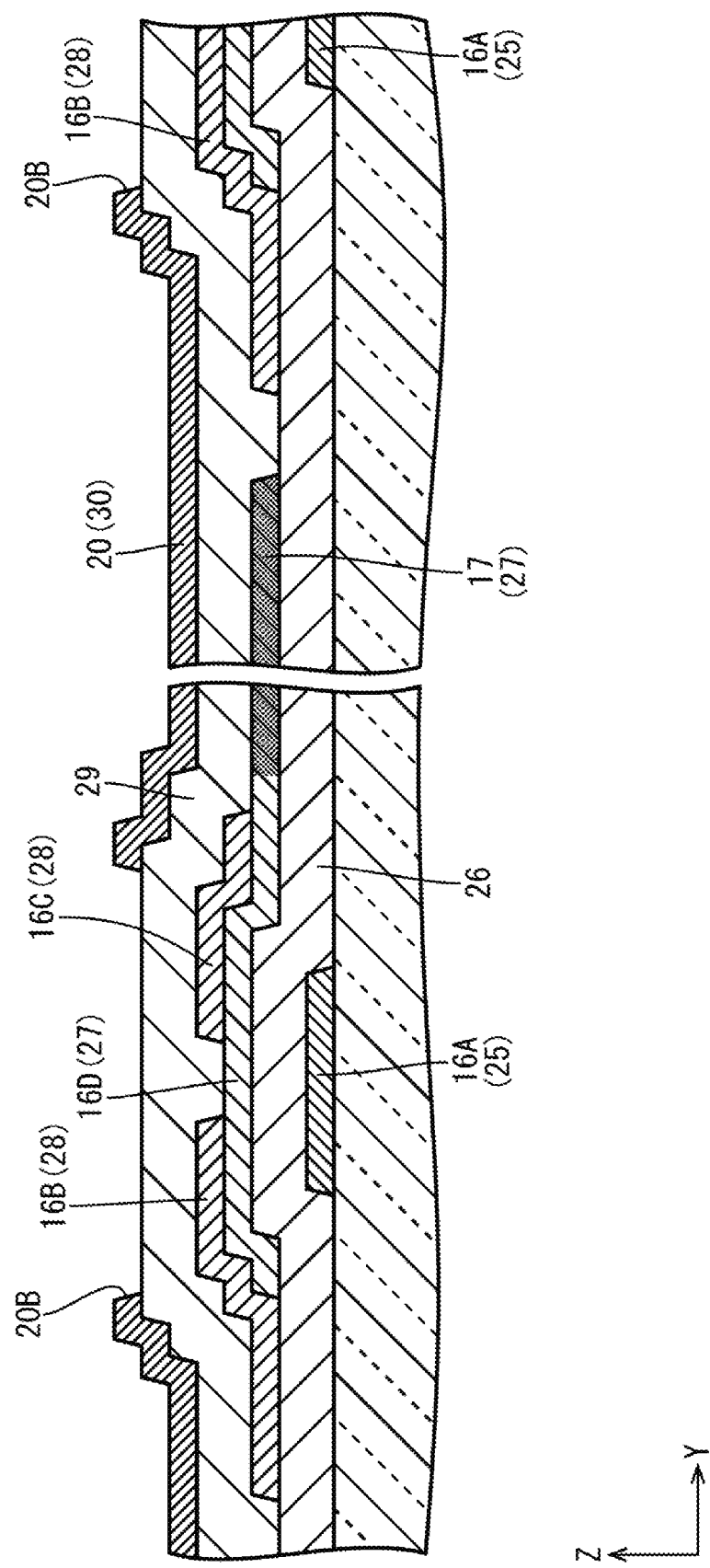
FIG. 18 is a cross-sectional view illustrating an interlayer insulating film formed in an interlayer insulating film forming process and a transparent electrode film formed on the interlayer insulating film formed and patterned in a transparent film forming process.

As illustrated in FIG. 17, in the photoresist film removing process, the photoresist film 44 is removed. The source electrodes 16B and the drain electrodes 16C constructed from the second metal film 28 are exposed. In the interlayer insulating film forming process, the interlayer insulating film 29 is formed on the semiconductor film 27 and the second metal film 28 and patterned using a photomask including a predefined pattern to form the contact holes 34, 36, 40, and 41 are formed in the interlayer insulating film 29 (see FIGS. 5, 6, and 8). The second terminals 32 and the second contacts 39 constructed from the second metal film 28 are disposed to overlap the second terminal contact holes 36 and the second contact holes 41. The contact holes 36 and 41 are not connected to other holes (see FIGS. 6 and 8). The first terminals 31 and the first contacts 38 are disposed to overlap the first terminal contact holes 34 and the first contact holes 40. The contact holes 34 and 40 are connected to the contact holes 34 and 40 of the gate insulating film 26 (see FIGS. 5 and 8). According to the processes described above, patterning of the gate insulating film 26 in the gate insulating film forming process is not required. Therefore, a photomask is not required in the gate insulating film forming process. This is preferable for reducing the production cost. As illustrated in FIG. 18, in the transparent electrode film forming process, the transparent electrode film 30 is formed on the interlayer insulating film 29 and patterned. The terminal protectors 33 and 35 and the connectors 42 are prepared in addition to the common electrode 20 (see FIGS. 5, 6, and 8).

Second Embodiment

Figure 19:
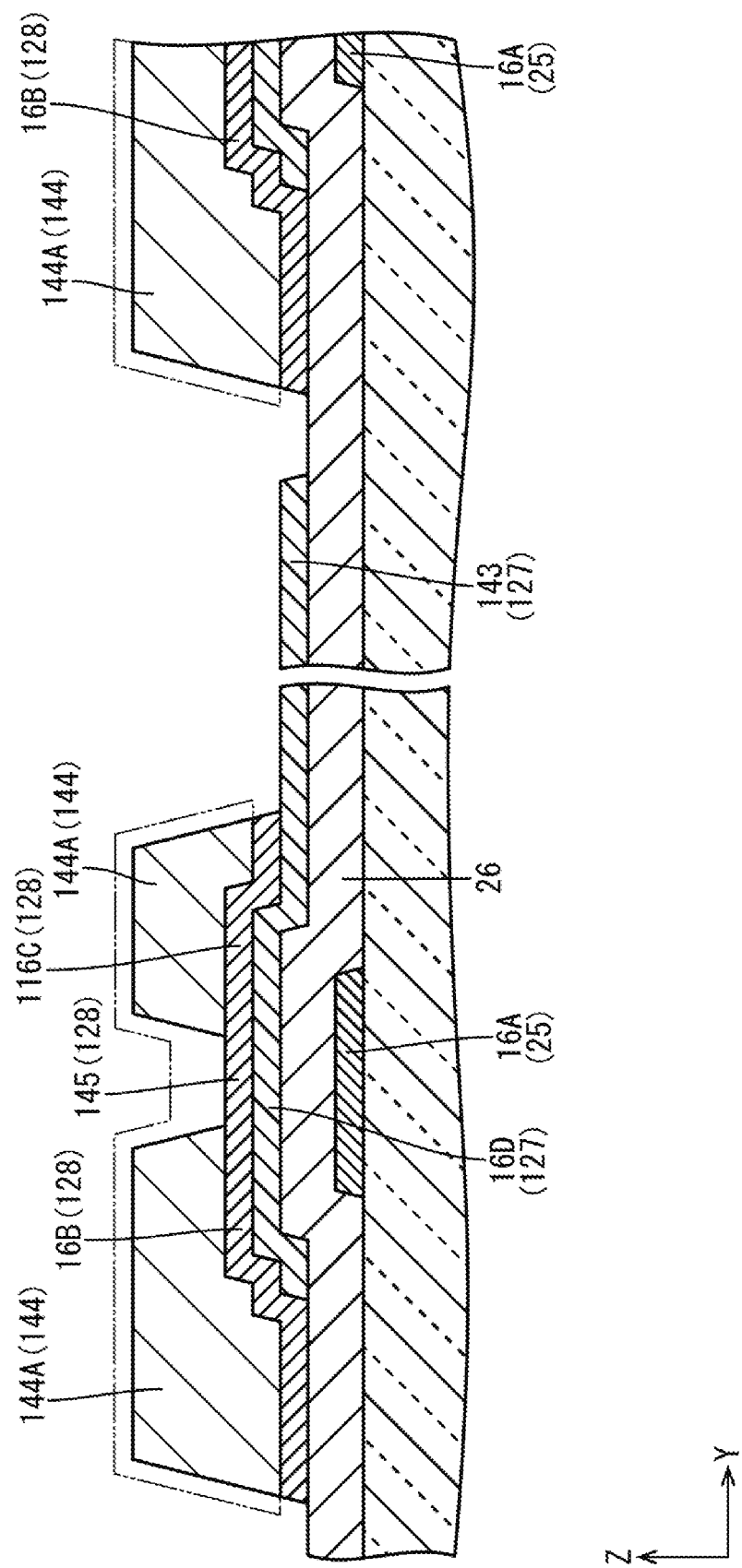
FIG. 19 is a cross-sectional view illustrating an array substrate from which a second thick portion of a photoresist film is removed in a second thick portion removing process performed after a first etching process in a method of producing an array substrate according to a second embodiment.
Figure 20:
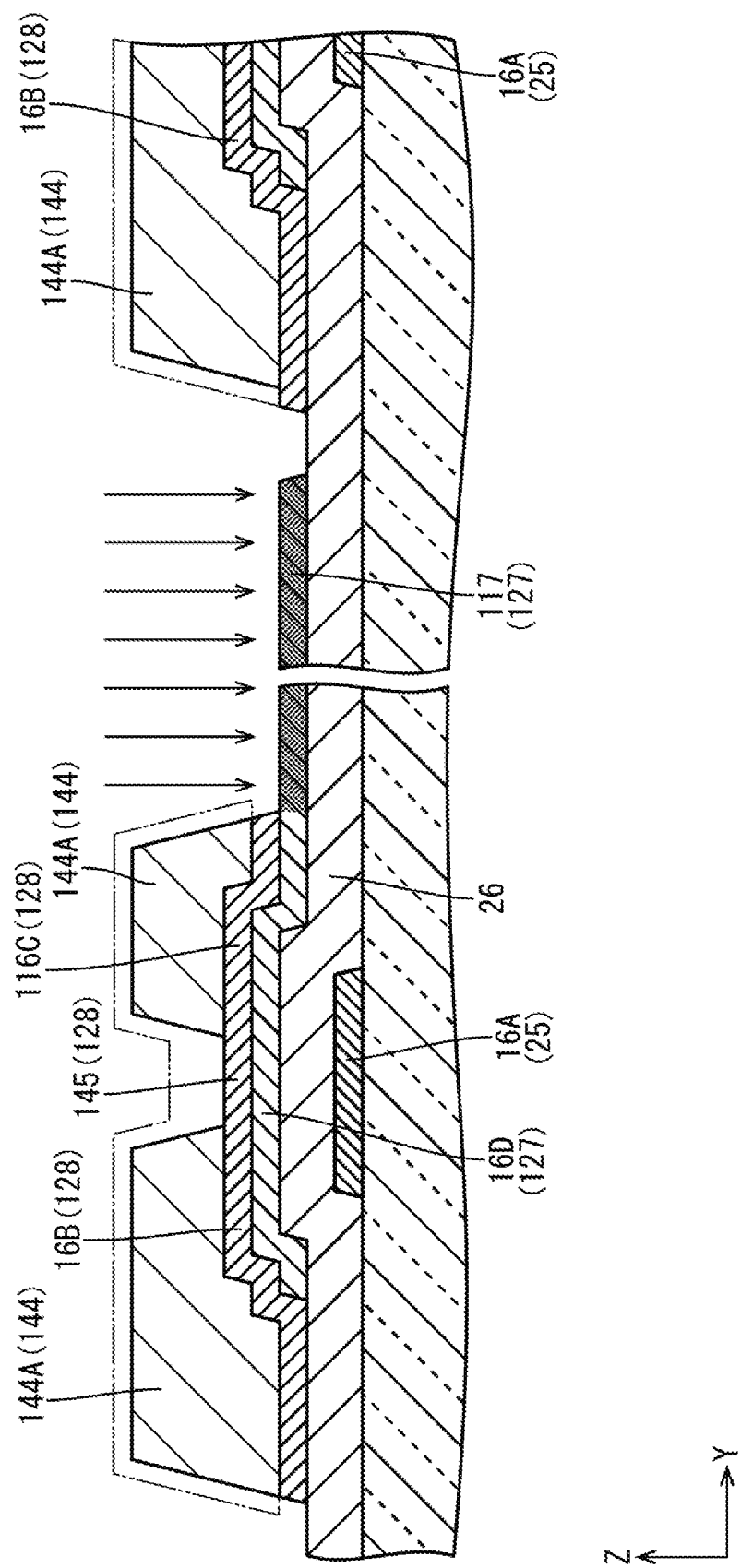
FIG. 20 is a cross-sectional view illustrating a resistance reducing process for reducing a resistance of a pixel electrode portion of a semiconductor film uncovered with the photoresist film.

A second embodiment will be described with reference to FIGS. 19 and 20. In the second embodiment, the second thick portion removing process is performed before the resistance reducing process. Configurations, operations, and effects similar to those of the first embodiment will not be described.

In a method of producing an array substrate according to this embodiment, the second thick portion removing process is performed between the first etching process and the resistance reducing process. Namely, the second thick portion removing process is performed after the first etching process (see FIG. 13) and before the resistance reducing process. As illustrated in FIG. 19, second thick portions 144B of a photoresist film 144 having a smaller thickness are removed in the second thick portion removing process. The asking processing performed in the second thick portion removing process has an effect entirely on the photoresist film 144. Therefore, thicknesses and areas of the source line overlapping portions and first thick portions 144A having larger thicknesses decrease. In FIGS. 19 and 20, edges of the photoresist film 144 before the second thick removing process are indicated with two-dashed chain lines. As illustrated in FIG. 20, in the resistance reducing process performed after the second thick portion removing process, portions of a semiconductor film 127 not covered with the photoresist film 144 and a second metal film 128, that is, resistances of pixel electrode portions 143 not overlapping the first thick portions 144A and inter-electrode portions 145 are reduced. Areas of the semiconductor film 127 in which the resistances are reduced increase because the areas of the first thick portions 144A are reduced through the asking processing in the second thick portion removing process. Areas of pixel electrodes 117 prepared through the resistance reducing processing increase and thus an aperture rate improves. Furthermore, transition portions are not created at boundaries between the pixel electrodes 117 and drain electrodes 116C. Therefore, currents that flow between the pixel electrodes 117 and the drain electrodes 116C increase.

Third Embodiment

Figure 21:
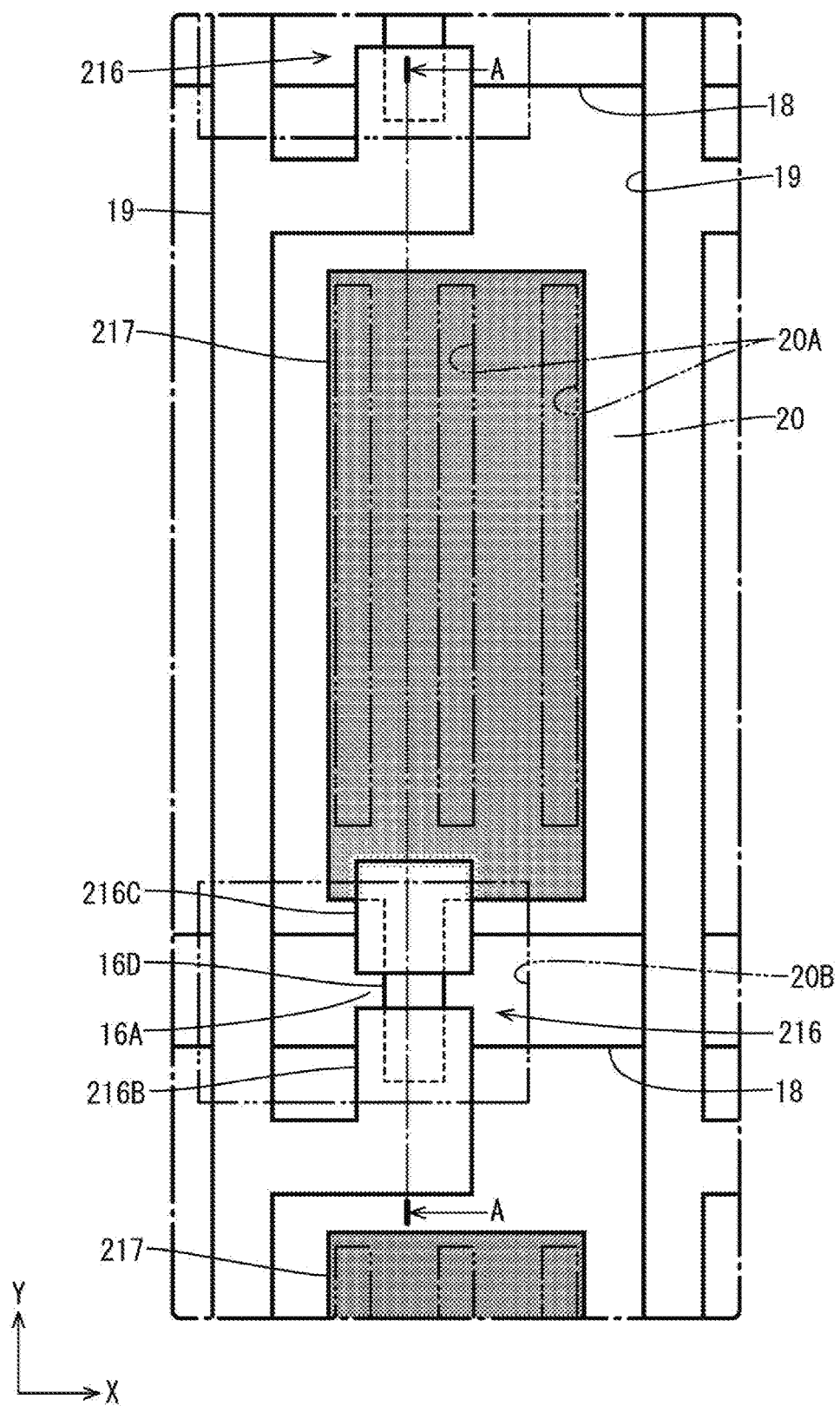
FIG. 21 is a plan view illustrating a two-dimensional configuration of an array substrate in a display area according to a third embodiment.
Figure 22:
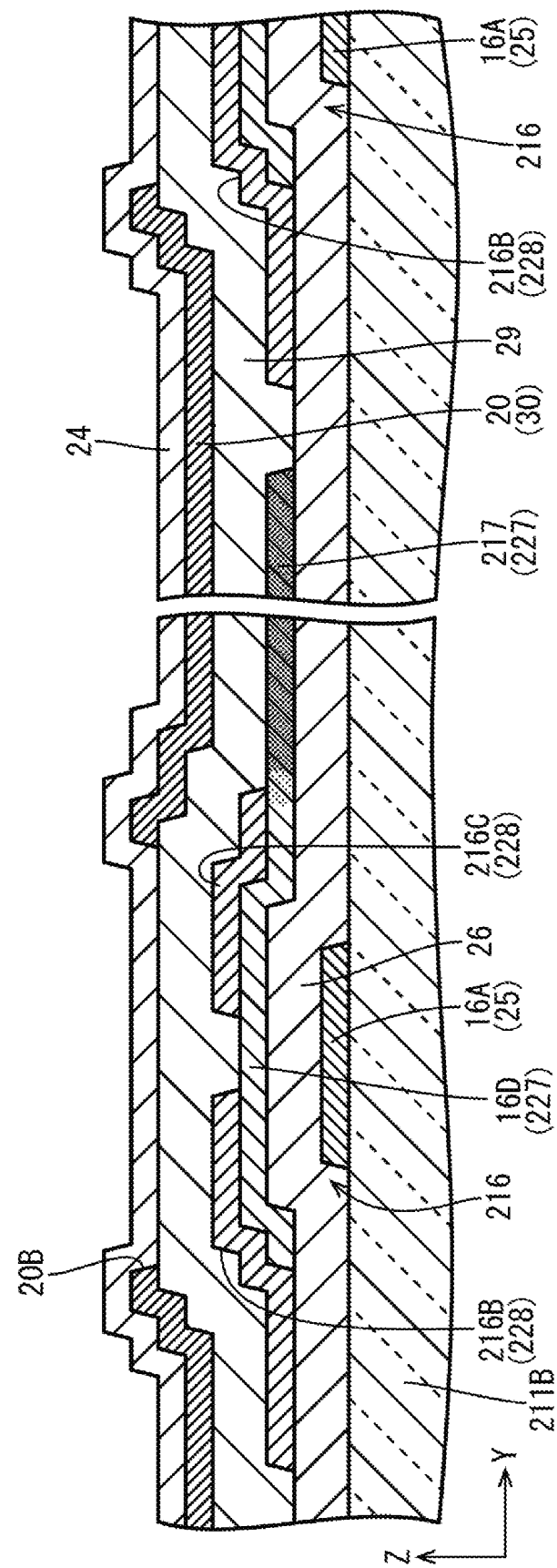
FIG. 22 is a cross-sectional view along line A-A in FIG. 21.

A third embodiment will be described with reference to FIGS. 21 and 22. The third embodiment includes a second metal film 228 having a configuration different from the second metal film 28 in the second embodiment. Configurations, operations, and effects similar to those of the second embodiment will not be described.

The second metal film 228 includes multiple metal layers, one of which is in contact with a semiconductor film 227 (an oxide semiconductor film) is made of molybdenum (Mo) or indium zinc oxide (IZO). The second metal film 228 has a two-layer structure including a first metal layer made of molybdenum and a second metal layer made of copper and formed on the first metal layer. Alternatively, the second metal film 228 has a three-layer structure including a first metal layer, a second metal layer, and a third metal layer layered in this sequence from the bottom. The first metal layer is a lowermost layer made of molybdenum or IZO. The second metal layer is a middle layer between the first metal layer and the third metal layer. The second layer is made of aluminum (Al) or copper (Cu). The third metal layer is an uppermost layer made of molybdenum or IZO. If the first metal layer is made of titanium or aluminum, oxygen may be taken out of the semiconductor film 227. Because the first metal layer is made of molybdenum or IZO, oxygen is less likely to be taken out of the semiconductor film 227. As illustrated in FIGS. 21 and 22, the resistances of the portions of the semiconductor film 227 overlapping source electrodes 216B and drain electrodes 216C of the second metal film 228 are less likely to be reduced due to molybdenum or IZO. The portions of the semiconductor film 227 are defined as resistance non-reduced portions. In the semiconductor film 227, boundaries between the resistance reduced portions (pixel electrodes 217) and the resistance non-reduced portions extend along edges of the drain electrodes 216C overlapping the pixel electrodes 217. In FIGS. 21 and 22, the resistance reduced portion of the semiconductor film 227 is in deeper shade and the transition portion is in lighter shade.

In the second metal film forming process included in the method of producing an array substrate 211B, the multiple metal layers are formed to prepare the second metal film 228. The first metal layer in contact with the semiconductor film 227 is made of molybdenum or IZO. The first metal layer made of molybdenum or IZO is patterned using a wet etching method in the first etching process and the second etching process. Therefore, the production cost is maintained low. However, accuracy in shaping ends of the source electrodes 216B and the drain electrodes 216C is low. Because the first metal layer in contact with the semiconductor film 227 is made of molybdenum or IZO, oxygen is less likely to taken out of the semiconductor film 227 in comparison to the first metal layer made of titanium or aluminum. Therefore, the resistances of the portions of the semiconductor film 227 overlapping the source electrodes 216B and the drain electrodes 216C of the second metal film 228 are less likely to decrease due to the first metal layer containing molybdenum or IZO. Turn-on currents of TFTs 216 tend to be small. In the resistance reducing process, the areas of the semiconductor film 227 in which the resistances are reduced are increased and the areas of the pixel electrodes 217 formed through the resistance reducing processing are increased as described in the second embodiment section (see FIG. 20). Charge transfer from the drain electrodes 216C to the pixel electrodes 217 easily occur. Although the accuracy in shaping the ends of the source electrodes 216B and the drain electrodes 216C is lower and the resistance of the semiconductor film 227 is not reduced by the first metal layer containing molybdenum or IZO, the turn-on currents can be maintained large.

Fourth Embodiment

A fourth embodiment will be described with reference to FIGS. 23 to 25. The fourth embodiment include source lines 319 and source lead lines 337 that are connected with each other differently from the source lines 19 and the source lead lines 37 in the first embodiment. The fourth embodiment further includes terminals 315 having a configuration different from the configuration of the terminals 15 in the first embodiment. Configurations, operations, and effects similar to those of the first embodiment will not be described.

Figure 23:
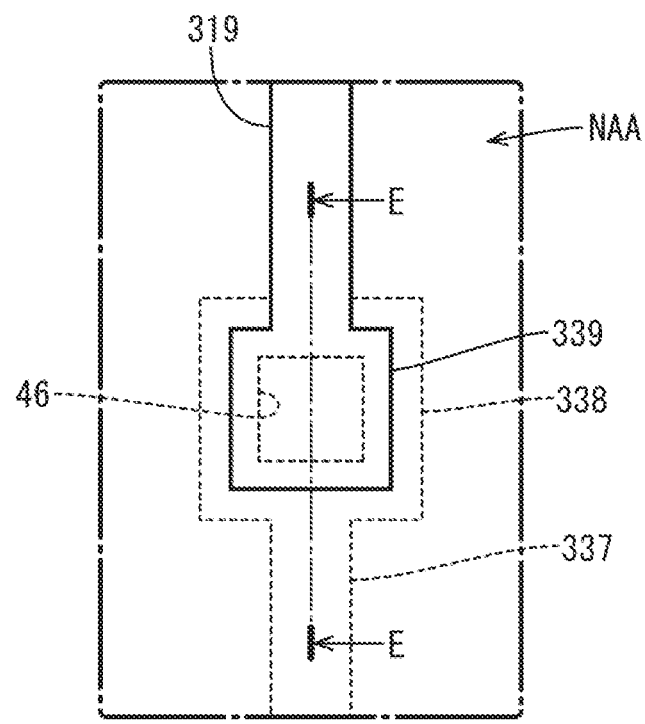
FIG. 23 is a plan view of a section of an array substrate in a non-display area including a connecting point of a source line and source lead lines and therearound according to a fourth embodiment.
Figure 24:
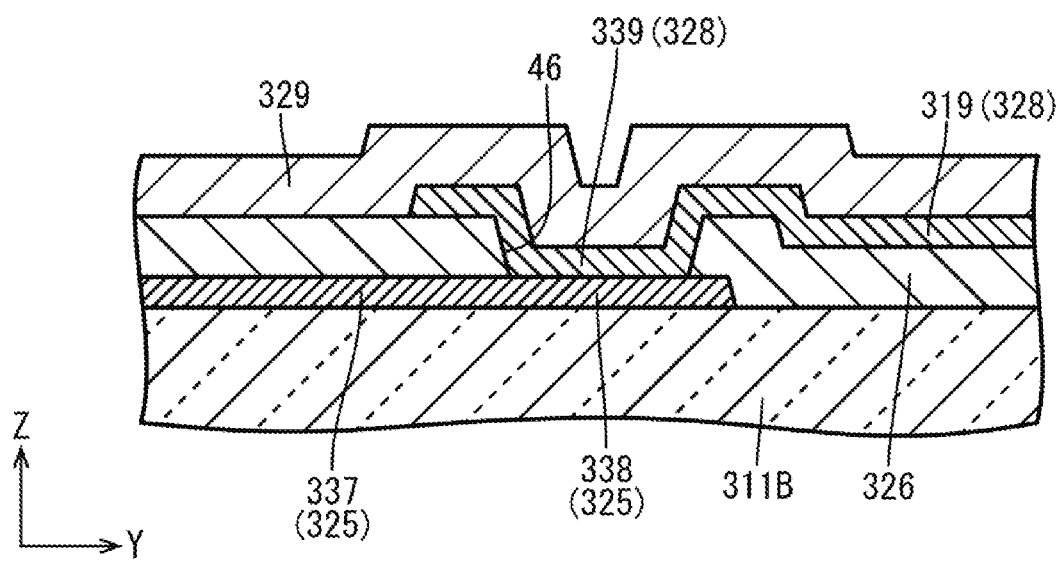
FIG. 24 is a cross-sectional view along line E-E.

As illustrated in FIGS. 23 and 24, first contacts of the source lead lines 337 and second contacts of the source lines 319 overlap each other. An interlayer insulating film 329 includes contact holes 46 that pass entirely through sections of the interlayer insulating film 329 in a thickness direction thereof at positions overlapping first contacts 338 and second contacts 339. The first contacts 338 are directly connected to the second contacts 339 via the contact holes 46. In comparison to the first embodiment in which the first contacts 38 and the second contacts 39 are disposed not to overlap each other and connected to each other via the connectors 42 constructed from the transparent electrode film 30 (see FIG. 8), structures of connecting the first contacts 338 to the second contacts 339 can be reduced in size and electric resistance related to the structures can be reduced.

Figure 25:
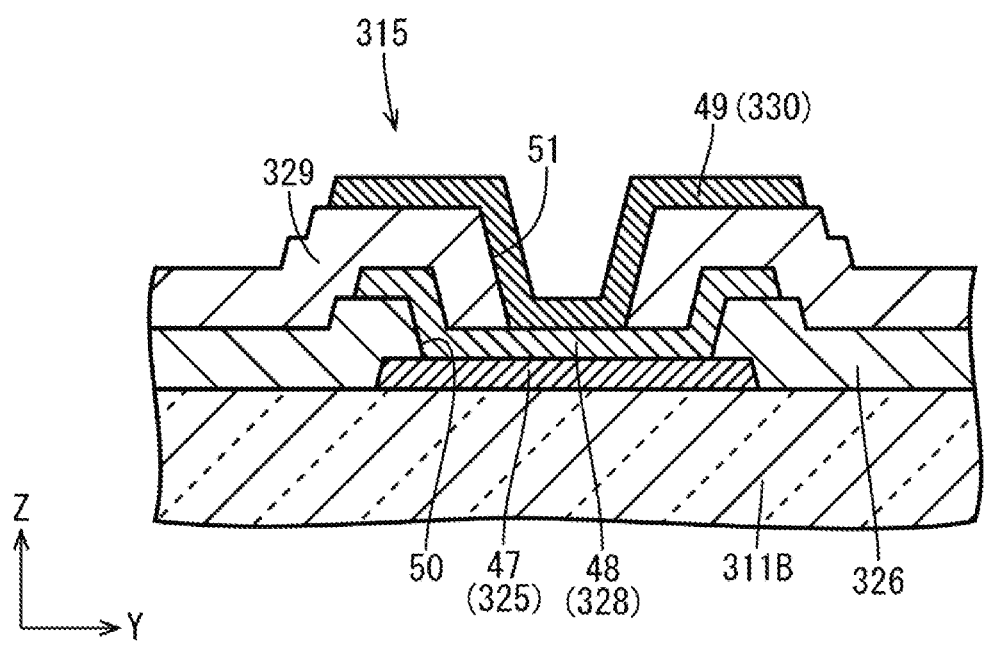
FIG. 25 is a cross-sectional view illustrating a section of a liquid crystal panel including a terminal and therearound.

As illustrated in FIG. 25, the terminals 315 include first overlapping terminals 47 (first terminals) and second overlapping terminals 48 (second terminals). The first overlapping terminals 47 are constructed from a first metal film 325. The second overlapping terminals 48 are constructed from a second metal film 328 and disposed to overlap the first overlapping terminals 47. Each terminal 315 is prepared by connecting the first overlapping terminal 47 and the second overlapping terminal 48 together. A gate insulating film 326 includes first overlapping terminal contact holes 50 (first terminal contact holes) which pass entirely through sections of the gate insulating film 326 in a thickness direction thereof at positions overlapping the first overlapping terminals 47 and the second overlapping terminals 48 for connecting the second overlapping terminals 48 to the first overlapping terminals 47. The interlayer insulating film 329 includes second overlapping terminal contact holes 51 (second terminal contact holes) which pass entirely through sections of the interlayer insulating film 329 in a thickness direction thereof at positions overlapping the second overlapping terminals 48 and terminal protectors 49 for connected the terminal protectors 49 to the second overlapping terminals 48. The first overlapping terminals 47 and the second overlapping terminals 48 that are connected to each other via the first overlapping terminal contact holes 50 are protected by the terminal protectors 49.

In a first metal film forming process includes in a method of producing an array substrate 311B, the first contacts 338 and the first overlapping terminals 47 are constructed from the first metal film 325. In a gate insulating film forming process, the contact holes 46 and the first overlapping terminal contact holes 50 are formed in the gate insulating film 326 at the positions overlapping the first contacts 338 and the first overlapping terminals 47. In a second metal film forming process, the second contacts 339 and the second overlapping terminals 48 are constructed from the second metal film 328. The second contacts 339 are connected to the first contacts 338 via the contact holes 46. The second overlapping terminals 48 are connected to the first overlapping terminals 47 via the first overlapping terminal contact holes 50. In the interlayer insulating film forming process, the second overlapping terminal contact holes 51 are formed in the interlayer insulating film 329 at positions overlapping the second contacts and the second overlapping terminals 48. In the transparent electrode film forming process, the terminal protectors 49 are constructed from a transparent electrode film 330. The terminal protectors 49 are connected to the second overlapping terminals 48 via the second overlapping contact holes 51.

Fifth Embodiment

A fifth embodiment will be described with reference to FIGS. 26 to 28. The fifth embodiment includes a liquid crystal panel 411 having a touch panel function (a position inputting function), which is different from the first embodiment. Configurations, operations, and effects similar to those of the first embodiment will not be described.

The liquid crystal panel 411 has a display function for displaying images on a screen and the touch panel function for detecting positions of input by a user based on images displayed on the screen. The liquid crystal panel 411 includes a touch panel integrally produced with in-cell technology. The touch panel uses projected capacitive touch technology and detection uses a self-capacitance method. The touch panel is disposed on an array substrate 411B. The touch panel includes touch electrodes 52 (position detection electrodes) disposed in a matrix within a plate surface of the array substrate 411B. The touch electrodes 52 are disposed in a display area AA of the array substrate 411B. A display area AA of the liquid crystal panel 411 corresponds substantially with a touching area (a position inputting area) in which the positions of input are detectable. A non-display area NAA of the liquid crystal panel 411 corresponds substantially with a non-touching area (a non-position inputting area) in which the positions of input are not detectable. When the user moves his or her fingertip (a position inputting member) toward a surface (a display surface) of the liquid crystal panel 11 to input a position based on an image displayed in the display area AA of the liquid crystal panel 411, the fingertip and the touch electrode 52 form a capacitor. A capacitance between the fingertip and the touch electrode 52 varies as the fingertip approaches the touch electrode 52. The capacitance differs from a capacitance at the touch electrodes 52 away from the fingertip. According to the difference in capacitance, the position of input can be detected.

Figure 26:
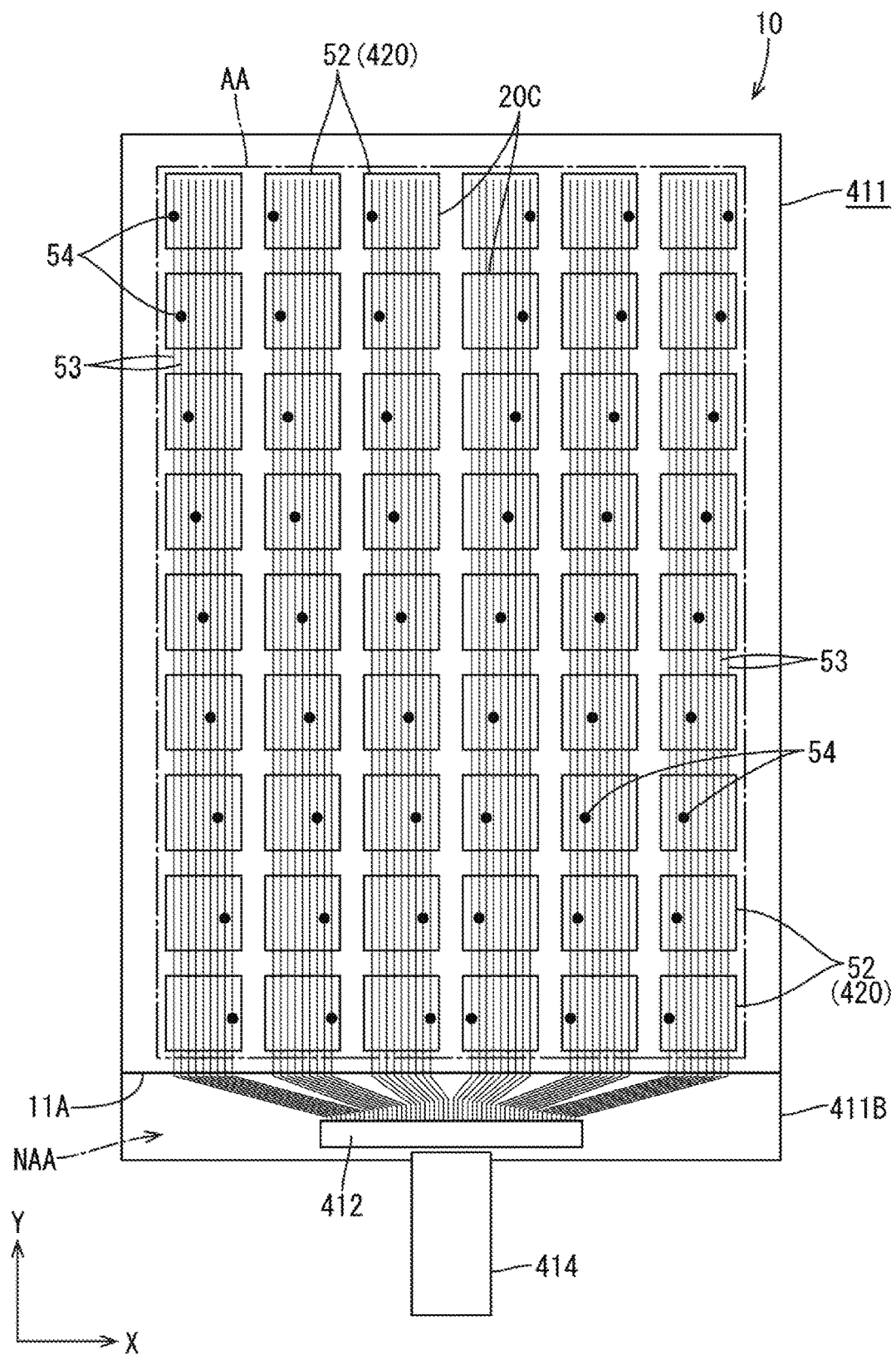
FIG. 26 is a plan view illustrating a two-dimensional arrangement of position detection electrodes and position detection lines included in a liquid crystal panel according to a fifth embodiment.

As illustrated in FIG. 26, a common electrode 420 on the array substrate 411B includes touch electrodes 52. The common electrode 420 includes slits 420A and TFT openings 420B that are similar to the slits 30A and the TFT openings 20B in the first embodiment. The common electrode 420 further includes separating openings 20C (separating slits) to separate the touch electrodes 52 from one another. The separating openings 20C include horizontal sections and vertical sections to form a grid in a plan view. The horizontal sections extend in the X-axis direction for an entire width of the common electrode 420. The vertical sections extend in the Y-axis direction for an entire length of the common electrode 420. The touch electrodes 52 included in the common electrode 420 are separated from one another by the separating openings 20C. Lines of the touch electrodes 52 are disposed in the X-axis direction and lines of the touch electrodes 52 are disposed in the Y-axis direction, that is, the touch electrodes 52 are disposed in a matrix in a plan view in the display area AA. The touch electrodes 52 are electrically independent from one another. Each touch electrode 52 has a square shape in the plan view. A dimension of each side of each touch electrode 52 is a few millimeters (e.g., about 2 mm to 5 mm). A two-dimensional size of each touch electrode 52 is significantly greater than that of each pixel electrode 417. Therefore, each touch electrode 52 covers multiple pixel electrodes 417 with respect to the X-axis direction and the Y-axis direction. Multiple touch lines 53 (position detection lines) on the array substrate 411B are selectively connected to the touch electrodes 52. The touch lines 53 extend in the Y-axis direction on the array substrate 411B. The touch lines 53 are connected to the specified touch electrodes 52 that are arranged in the Y-axis direction. The touch lines 53 are connected to a detection circuit. The detection circuit may be included in a driver 412 or disposed outside the liquid crystal panel 411 and connected to the liquid crystal panel via a flexible circuit board 414. The touch lines 53 supply reference voltage signal related to the display function and touch signals related to the touch function to the touch electrodes 52 with different timing. When the reference voltage signals are transmitted to all of the touch lines 53 with the same timing, the all of the touch electrodes 52 are held the reference potential to function as the common electrode 420. The number and the arrangement of the touch electrodes 52 are not those in FIG. 26 and may be altered where appropriate.

Figure 27:
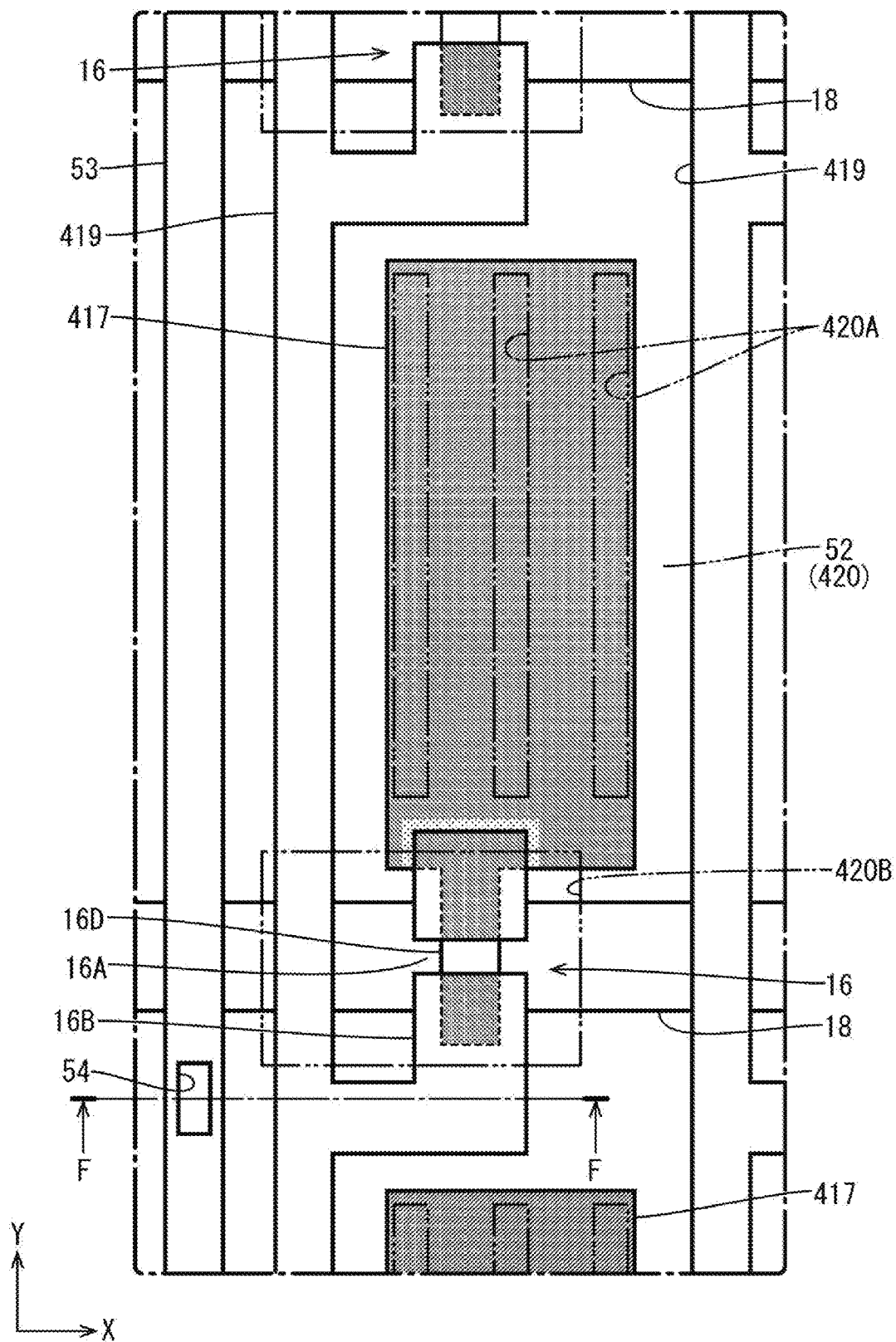
FIG. 27 is a plan view schematically illustrating a two-dimensional configuration of an array substrate in a display area.
Figure 28:
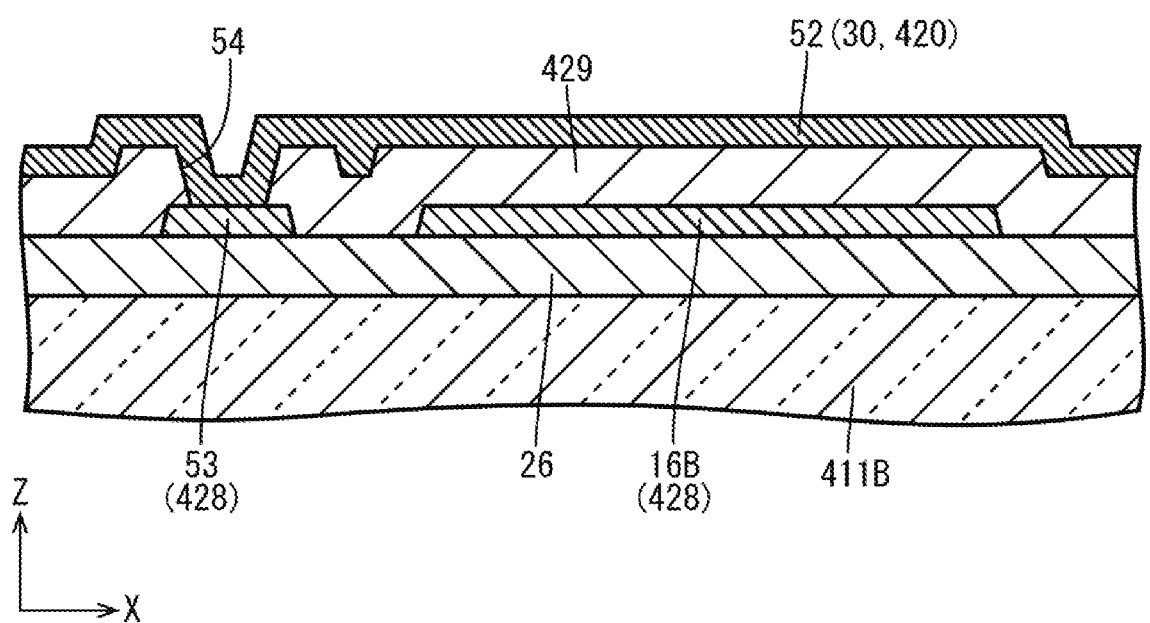
FIG. 28 is a cross-sectional view along line F-F in FIG. 27.

As illustrated in FIG. 27, the touch lines 53 are disposed on an opposite side from the pixel electrodes 417 to which the touch lines 53 are connected relative to the source lines 419 with respect to the X-axis direction. The touch lines 53 are parallel to the source lines 419. As illustrated in FIG. 28, the touch lines 53 are constructed from a second metal film 428 from which the source lines 419 are constructed. An interlayer insulating film 429 includes touch line contact holes 54 that pass entirely through sections of the interlayer insulating film 429 in a thickness direction thereof at positions overlapping the touch electrodes 52 and the touch lines 53. The touch lines 53 are connected to the touch electrodes 52 via the touch line contact holes 54. The touch line contact holes 54 are formed in the interlayer insulating film forming process included in the method of producing the array substrate 411B in which other contact holes 34, 36, 40, and 41 are formed (see FIGS. 5, 6, and 8). As illustrated in FIG. 26, the touch lines 53 extend substantially along the Y-axis direction to cross all of the touch electrodes 52. However, the touch lines 53 are connected to the selected touch electrodes 52 according to locations of the touch line contact holes 54. The touch electrodes 52 are disposed to overlap the touch lines 53 to which the touch electrodes 52 are connected and the touch lines 53 to which the touch electrodes 52 are not connected with the interlayer insulating film 429 therebetween. In FIG. 26, the touch line contact holes 54 are indicated with black dots.

OTHER EMBODIMENTS

The technology described herein is not limited to the embodiments described above and with reference to the drawings. The following embodiments may be included in the technical scope.

(1) The first metal layer of the first metal film may be made of aluminum or alloy containing titanium or aluminum.

(2) The third embodiment may include a second metal film including a first metal layer made of alloy containing molybdenum or IZO instead of the second metal film 228.

(3) The number, the sequence, or the kinds of metal layers in the second metal film in each of the above embodiments may be altered where appropriate. For example, molybdenum or IZO may be used for the material of the second metal film in each of the first and the second embodiments. The second metal film may be configured to include a single layer.

(4) Vacuum anneal processing may be used for the resistance reducing processing.

(5) A grey-tone mask including transmissive areas and semitransmissive areas similar to the halftone mask may be used in the photoresist film forming process in each of the above embodiments.

(6) The photoresist film in each of the above embodiments may be made of negative-type photo sensitive material. In this case, the transmissive areas and the blocking areas of the halftone mask in the first embodiment may be inverted.

(7) The terminals 15 in the first embodiment may include only the first terminals 31 or the second terminals 32.

(8) The technology described herein may be applied to connecting structures for connecting lines other than source lines to lead lines.

(9) The basic configuration of the third embodiment other than the second metal film 228 including the first metal layer made of molybdenum or IZO may be based on the first embodiment instead of the second embodiment.

(10) The fifth embodiment may include a mutual-capacitance type touch panel instead of the self-capacitance type touch panel.

(11) The driver in each of the above embodiments mounted on the array substrate through the COG technology may be mounted on the flexible circuit board through the chip-on-film (COF) technology.

(12) The technology described herein may be applied to reflection-type liquid crystal panels and semi-reflection-type liquid crystal panels.

(13) The technology described herein may be applied to liquid crystal display devices having horizontally-long rectangular shapes, square shapes, circular shapes, semicircular shapes, oval shapes, elliptical shapes, and trapezoidal shapes.

(14) The first contacts 38 in the first embodiment may be disposed to overlap the second contacts 39. More specifically, the first contacts 38 may be extended to entirely cover the second contacts 39 or sections of the second contacts may be disposed in the first contact holes 40 to overlap the first contacts 38. In the latter case, the first contacts 38 and the second contacts 39 are exposed through the first contact holes 40 and the connectors 42 are connected to the first contacts 38 and the second contacts 39 via the first contact holes 40. Therefore, the second contact holes 41 may not be required. Alternatively, semiconductor portions may be constructed from a semiconductor film and exposed through first contact holes, and second contacts may be disposed to overlap the semiconductor portions and exposed through the first contact holes such that sections of the second contacts overlap first contacts. In this case, the first contacts, the second contacts, and the semiconductor portions are exposed through the first contact holes and connectors are connected to the first contacts, the second contacts, and the semiconductor portions. Therefore, second contact holes may not be required.

The invention claimed is:

1. A thin film transistor array substrate including thin film transistors, the thin film transistor array substrate comprising:
   gate electrodes of the thin film transistors, the gate electrodes being made from a first metal film;
   a first insulating film on the first metal film;
   channels of the thin film transistors, the channels being made from a semiconductor film on the first insulating film and overlapping the gate electrodes;
   source electrodes of the thin film transistors, the source electrodes being made from a second metal film on the semiconductor film and connected to first ends of the channels;
   drain electrodes of the thin film transistors, the drain electrodes being made from the second metal film and connected to second ends of the channels;
   pixel electrodes including portions of the semiconductor film having reduced resistances and being connected to the drain electrodes;

a second insulating film on the semiconductor film and the second metal film and including first sections overlapping the pixel electrodes without openings and second sections filling gaps between the source electrodes and the drain electrodes of adjacent thin film transistors, the second sections including bottom surfaces directly contacting top surfaces of the channels; and a common electrode constructed from a transparent electrode film on the second insulating film and overlapping at least the pixel electrodes.

2. The thin film transistor array substrate according to claim 1, wherein the semiconductor film is an oxide semiconductor film, the second metal film includes metal layers, and one of the metal layers in contact with the oxide semiconductor film contains at least one of molybdenum and indium zinc oxide.

3. The thin film transistor array substrate according to claim 1, wherein the common electrode includes position detection electrodes that define a capacitor with a position inputting member to detect a position of input by the position inputting member.

4. The thin film transistor array substrate according to claim 1, wherein the semiconductor film includes first sections overlapping the drain electrodes and second sections between the first sections of the semiconductor film and the pixel electrodes, and the second sections of the semiconductor film have resistances greater than resistances of the pixel electrodes but less than resistances of the channels.

* * * * *